(12) United States Patent
Rizzolo et al.

(10) Patent No.: US 12,464,960 B2
(45) Date of Patent: Nov. 4, 2025

(54) METAL HARD MASK INTEGRATION FOR ACTIVE DEVICE STRUCTURES

(71) Applicant: International Business Machines Corporation, Armonk, NY (US)

(72) Inventors: Michael Rizzolo, Delmar, NY (US); Takashi Ando, Eastchester, NY (US); Lawrence A. Clevenger, Saratoga Springs, NY (US); Kevin W. Brew, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 804 days.

(21) Appl. No.: 17/537,667

(22) Filed: Nov. 30, 2021

(65) Prior Publication Data
US 2023/0172081 A1  Jun. 1, 2023

(51) Int. Cl.
*H10N 70/00* (2023.01)
*H10B 63/00* (2023.01)

(52) U.S. Cl.
CPC ......... *H10N 70/841* (2023.02); *H10N 70/063* (2023.02); *H10B 63/80* (2023.02); *H10N 70/826* (2023.02); *H10N 70/8833* (2023.02)

(58) Field of Classification Search
CPC .............................. H10N 70/826; H10N 70/841
See application file for complete search history.

(56) References Cited

U.S. PATENT DOCUMENTS

| | | | |
|---|---|---|---|
| 7,052,621 B2 | 5/2006 | Kumar et al. | |
| 7,713,755 B1 | 5/2010 | Xiao et al. | |
| 9,368,716 B2 | 6/2016 | Gu et al. | |
| 10,770,653 B1 | 9/2020 | Penny et al. | |
| 10,903,421 B2 | 1/2021 | Kong et al. | |
| 2020/0357852 A1 | 11/2020 | Miyazoe et al. | |
| 2023/0172081 A1* | 6/2023 | Rizzolo | H10N 70/841 257/4 |

OTHER PUBLICATIONS

Disclosed Anonymously, "Method for RRAM Pillar Profile Control For Wide Range (um to sub-100nm) Pillar Sizes" IPCOM000255866D, Oct. 17, 2018, 6 pages.
Disclosed Anonymously, "Process-Induced Forming of RRAM Device with Dummy CMP Structure," PCOM000263964D, Oct. 27, 2020, 11 pages.
H.-S. P. Wong et al., "Metal-Oxide RRAM," Proceedings of the IEEE, vol. 100, No. 6, Jun. 2012, pp. 1951-1970.

* cited by examiner

*Primary Examiner* — Mark V Prenty
(74) *Attorney, Agent, or Firm* — L. Jeffrey Kelly; Ryan, Mason & Lewis, LLP

(57) ABSTRACT

A semiconductor structure comprises an active device stack comprising one or more layers, the one or more layers comprising a top electrode. The semiconductor structure also comprises an additional layer disposed over the active device stack, an encapsulation layer surrounding the active device stack and the additional layer, and a contact to the top electrode coupled to the additional layer.

17 Claims, 26 Drawing Sheets

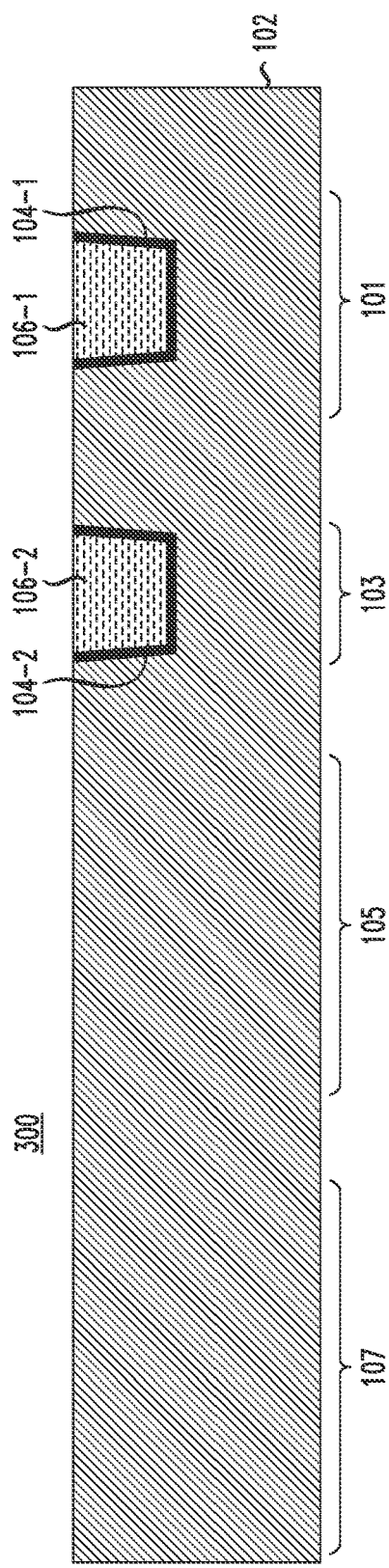
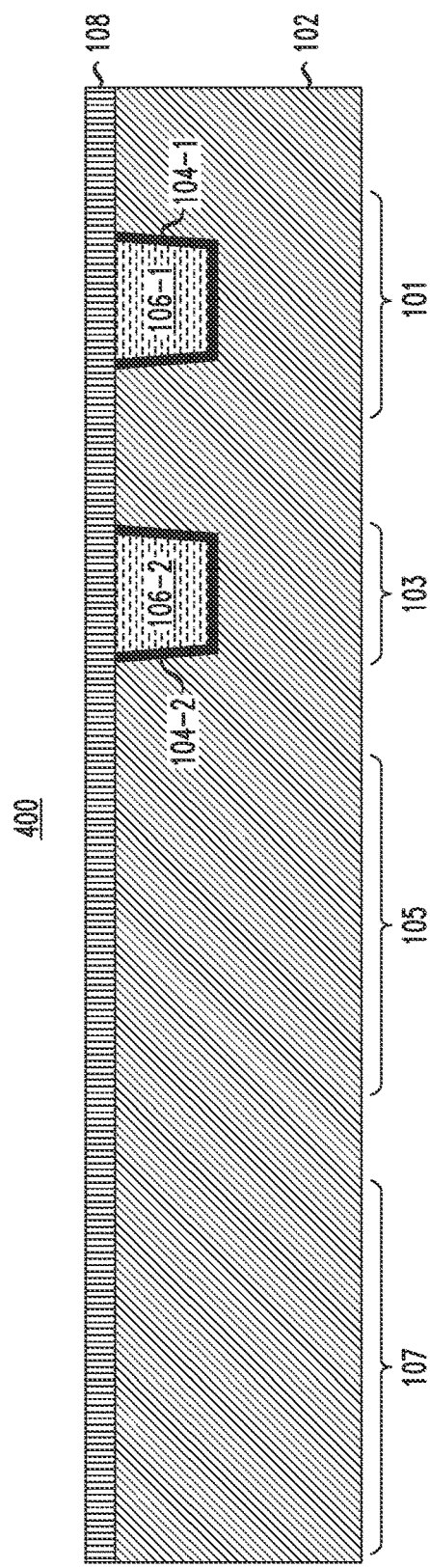

500

600

700

800

900

1100

1200

1300

1400

1600

2100

2700

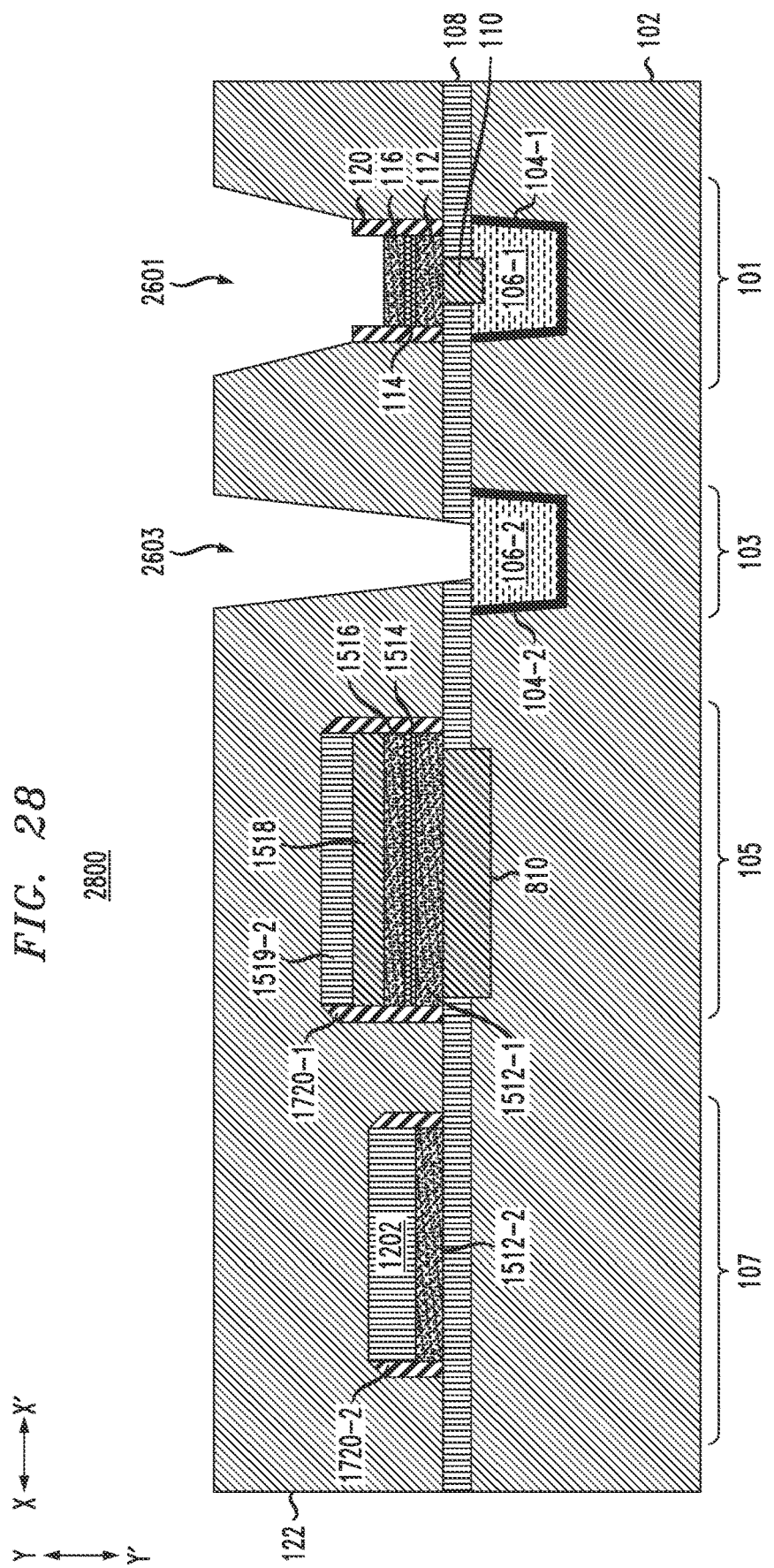

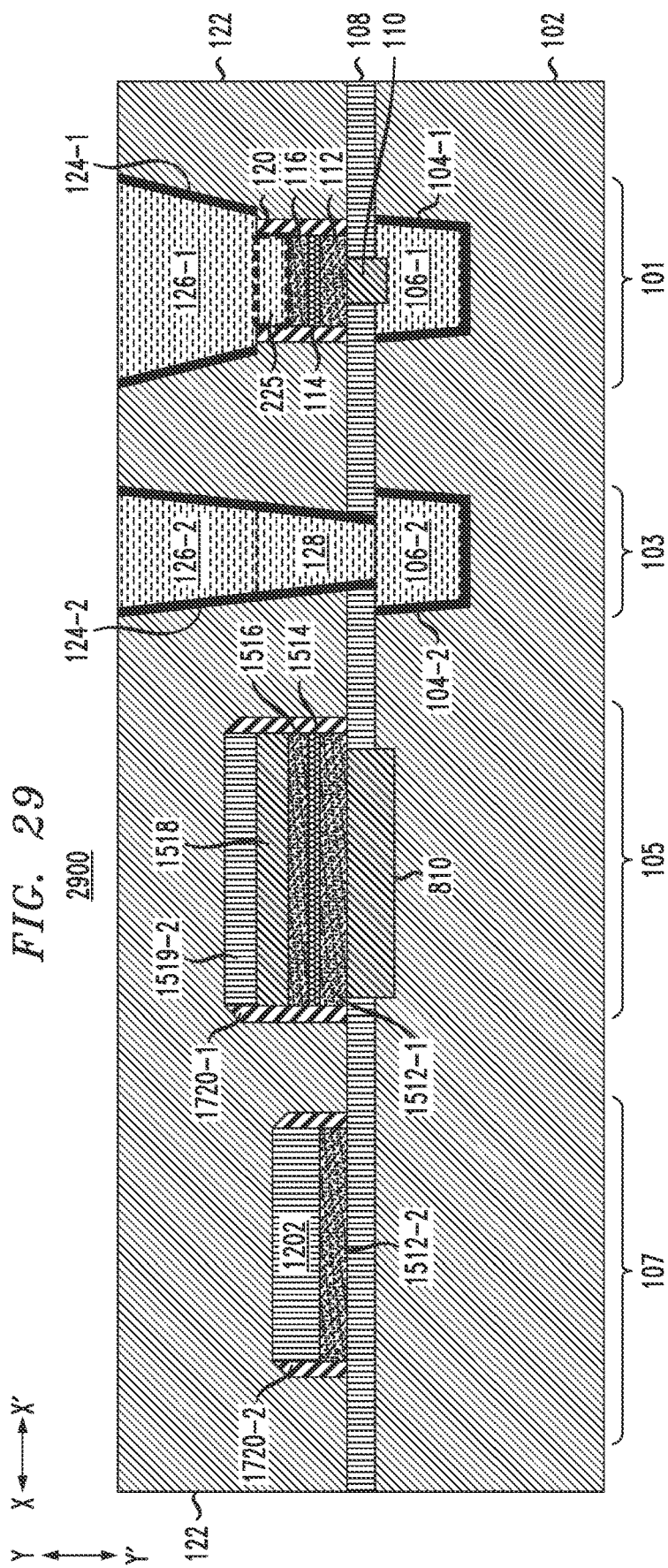

METAL HARD MASK INTEGRATION FOR ACTIVE DEVICE STRUCTURES

BACKGROUND

The present application relates to semiconductors, and more specifically, to techniques for forming semiconductor structures. Semiconductors and integrated circuit chips have become ubiquitous within many products, particularly as they continue to decrease in cost and size. There is a continued desire to reduce the size of structural features and/or to provide a greater amount of structural features for a given chip size. Miniaturization, in general, allows for increased performance at lower power levels and lower cost. Present technology is at or approaching atomic level scaling of certain micro-devices such as logic gates, field-effect transistors (FETs), and capacitors.

SUMMARY

Embodiments of the invention provide techniques for forming active device structures having additional layers disposed between top electrodes and top electrode contacts enabling integration with metal hard mask processing.

In one embodiment, a semiconductor structure comprises an active device stack comprising one or more layers, the one or more layers comprising a top electrode. The semiconductor structure also comprises an additional layer disposed over the active device stack, an encapsulation layer surrounding the active device stack and the additional layer, and a contact to the top electrode coupled to the additional layer.

In another embodiment, an integrated circuit comprises a non-volatile memory device structure. The non-volatile memory device structure comprises a non-volatile memory device stack comprising one or more layers, the one or more layers comprising a top electrode, an additional layer disposed over the non-volatile memory device stack, an encapsulation layer surrounding the non-volatile memory device stack and the additional layer, and a contact to the top electrode coupled to the additional layer.

In another embodiment, a method comprises forming an active device stack comprising one or more layers, the one or more layers comprising a top electrode. The method also comprises forming an additional layer over the top electrode of the active device stack, forming an encapsulation layer surrounding the active device stack and the additional layer, and forming a contact to the top electrode, the contact being coupled to the additional layer.

These and other features and advantages of embodiments described herein will become more apparent from the accompanying drawings and the following detailed description.

BRIEF DESCRIPTION OF THE DRAWINGS

FIG. 3 depicts a cross-sectional view of a semiconductor structure including landing pads formed in an interlevel dielectric layer, according to an embodiment of the invention.

FIG. 4 depicts a cross-sectional view of the FIG. 3 structure following formation of a capping layer, according to an embodiment of the invention.

FIG. 28 depicts a cross-sectional view of the FIG. 27 structure following removal of remaining portions of the hard mask stack, according to an embodiment of the invention.

FIG. 29 depicts a cross-sectional view of the FIG. 28 structure following formation of contacts and vias in the contact and via trenches, according to an embodiment of the invention.

FIG. 30 depicts an integrated circuit comprising active device structures having additional layers disposed between top electrodes and top electrode contacts enabling integration with metal hard mask processing, according to an embodiment of the invention.

DETAILED DESCRIPTION

Figure 1A:
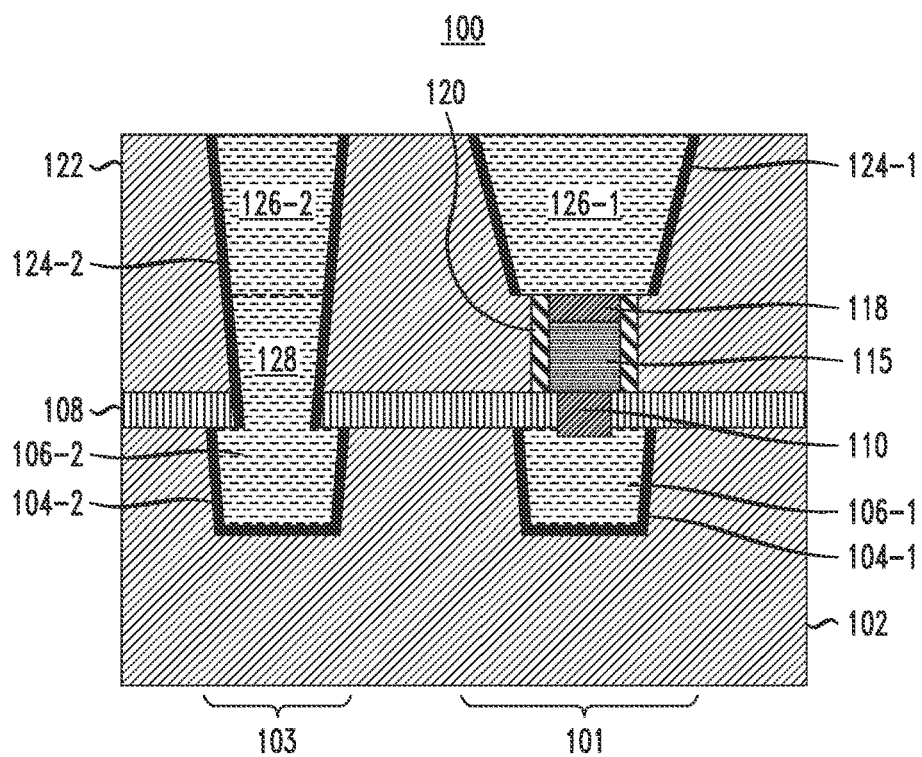
FIG. 1A depicts a cross-sectional view of a semiconductor structure including a protection layer formed over a top electrode of an active device pillar, the protection layer protecting the top electrode of the active pillar during hard mask processing used for formation of a contact to the top electrode of the active device pillar, according to an embodiment of the invention.

Illustrative embodiments of the invention may be described herein in the context of illustrative methods for enabling metal hard mask integration for active device structures, along with illustrative apparatus, systems and devices formed using such methods. However, it is to be understood that embodiments of the invention are not limited to the illustrative methods, apparatus, systems and devices but instead are more broadly applicable to other suitable methods, apparatus, systems and devices.

It is to be understood that the various features shown in the accompanying drawings are schematic illustrations that are not necessarily drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the terms "exemplary" and "illustrative" as used herein mean "serving as an example, instance, or illustration." Any embodiment or design described herein as "exemplary" or "illustrative" is not to be construed as preferred or advantageous over other embodiments or designs.

As semiconductors continue to scale (e.g., to 14 nanometer (nm) nodes and beyond), there is a need for new hard mask processing techniques. Hard mask schemes with full hard mask removal may use a titanium nitride (TiN) metal hard mask material. Such hard mask schemes, however, are not compatible with various structures that utilize TiN as a top electrode material. Such structures include, but are not limited to, various non-volatile memory (NVM) device structures, including phase-change memory (PCM) structures, resistive random access memory (RRAM or ReRAM) structures, magnetic random access memory (MRAM) structures, etc. In order to integrate NVM device cells (e.g., PCM, RRAM or MRAM cells) in a cross-bar array structure with copper (Cu) metallization, the NVM device stacks need to be protected during Cu damascene integration processes. When the NVM device stacks are exposed for contact formation, spacer materials on the sidewalls of the stacks are pulled down and weak spots are created. The NVM device stacks are further attacked during wet etching processes used for Cu damascene integration. Such wet etching includes TiN etching with diluted hydrofluoric acid (DHF).

Illustrative embodiments address the above-mentioned problems by employing a protection layer on NVM device stacks or other structures. The protection layer may comprise a material that is different than that utilized for the top electrode of the NVM device stack or other structure. For example, the protection layer may comprise tantalum nitride (TaN) and the top electrode may comprise TiN. The protection layer is kept to protect the NVM device stacks or other underlying structures (e.g., which may use a TiN top electrode) during hard mask removal (e.g., TiN hard mark removal) in Cu damascene integration processing (e.g., for forming contacts to the NVM device stacks or other underlying structures). The final structure thus features via contacts on NVM device stacks in a self-aligned manner, with the protection layer remaining in the NVM device stacks in the alignment area of the chip.

Alternatively, some embodiments utilize a same material for the hard mask and the protection layer (e.g., TaN) for Cu damascene integration processing. In such embodiments, the hard mask material can thus be removed simultaneous with the protection layer. For example, a TaN hard mask may be used for Cu damascene integration processing instead of a TiN hard mask, and the TaN hard mask and the protection layer (e.g., also formed of TaN) are removed simultaneously selective to the underlying NVM device stack or other structure (e.g., which includes a TiN top electrode).

In some embodiments, a semiconductor structure includes a pillar with a protection layer formed over the pillar. The pillar may comprise a NVM device pillar or stack (e.g., for a PCM, RRAM or MRAM structure), with the protection layer (e.g., formed of TaN) abutting a top electrode (e.g., formed of TiN) of the pillar for non-contacted devices. The contact vias may directly land on the protection layer for active devices. The protection layer may alternatively be removed (e.g., in conjunction with removal of a hard mask formed of the same material), such that the contact vias directly land on the pillars (e.g., top electrodes thereof) for active devices. The pillars may be formed by depositing the protection layer (e.g., a TaN hard mask) on the top electrodes (e.g., formed of TiN), with the protection layer being patterned using lithography and etching processes. Via connections to the pillars may be made by using Cu damascene processing with a hard mask that is the same material as the top electrodes of the pillars (e.g., TiN). The hard mask is formed of a material that can be removed selective to that of the protection layer deposited on the pillars. In another embodiment, via connections to the pillars may be made by using Cu damascene processing with a hard mask that is the same material as the protection layer (e.g., TaN). The hard mask and the protection layer (e.g., both formed of the same material, TaN) are removed simultaneously.

Figure 1B:
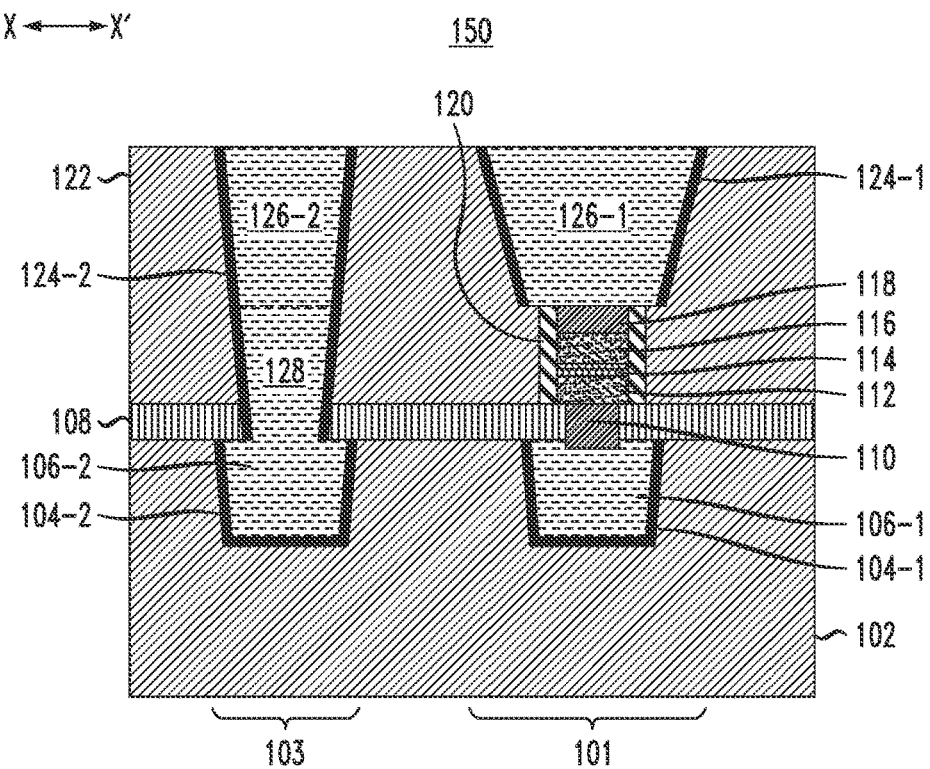
FIG. 1B depicts a cross-sectional view of a semiconductor structure including a protection layer formed over a top electrode of a resistive random access memory device pillar, the protection layer protecting the top electrode of the resistive random access memory device pillar during hard mask processing used for formation of a contact to the top electrode of the resistive random access memory device pillar, according to an embodiment of the invention.

FIGS. 1A and 1B show respective cross-sectional views 100 and 150 of semiconductor structures which include different types of active device structures. FIG. 1A illustrates a generic active device structure, and FIG. 1B illustrates an RRAM active device structure. The structures of FIGS. 1A-1D structures include an interlevel dielectric (ILD) layer 102, in which landing pads of a first metallization level are formed. The landing pads of the first metallization level include respective liner layers 104-1 and 104-2 and metal layers 106-1 and 106-2.

The ILD layer 102 may be formed of any suitable isolating material, including but not limited to a low-k dielectric material such as silicon dioxide ($SiO_2$), silicon oxycarbide (SiOC), silicon oxynitride (SiON), etc. The ILD layer 102 is formed with sizing that is sufficient to cover other portions of the structure (e.g., the landing pads of the first metallization level).

The liner layers 104-1 and 104-2, which may also be referred to as metal adhesion layers or barrier layers, may be formed of various materials depending on the material that is used for the metal layers 106-1 and 106-2. The liner layers 104-1 and 104-2 may have a uniform thickness in the range of 2-5 nm.

The metal layers 106-1 and 106-2 may be formed of a low resistance metal such as copper (Cu), ruthenium (Ru), tungsten (W), cobalt (Co), etc. The metal layers 106-1 and 106-2 may be formed with widths (in direction X-X') in the range of 50-500 nm, and with heights (in direction Y-Y') in the range of 50-500 nm. As noted above, the material of the liner layers 104-1 and 104-2 may vary based on what material is used for the metal layers 106-1 and 106-2. For example, if the metal layers 106-1 and 106-2 are formed of Cu, the liner layers 104-1 and 104-2 may be formed of tantalum (Ta) or TaN. As another example, if the metal layers 106-1 and 106-2 are formed of W or Co, the liner layers 104-1 and 104-2 may be formed of TiN. Various other combinations of materials for the liner layers 104-1 and 104-2 and the metal layers 106-1 and 106-2 may be utilized.

A capping layer 108 is formed over the ILD layer 102 and the landing pads. The capping layer 108 may be formed of silicon nitride (SiN) or another suitable material such as $SiO_2$, a carbon doped oxide dielectric comprising silicon, carbon, oxygen and hydrogen (SiCOH), tetraethyl orthosilicate (TEOS), etc. The capping layer 108 may have a height (in direction Y-Y') of about 25 nm.

A confined electrode 110 is formed over the ILD layer 102 in the capping layer 108 in an active device region 101. The confined electrode 110 is commonly used for NVM structures such as PCM. The confined electrode 110 may be formed of TaN or another suitable material such as TiN, a multilayer of TiN/TaN, or other metal nitrides, a single metal such as Ti, Ta, W, etc. depending on the technology. The confined electrode 110 may have a width (in direction X-X') in the range of 20-100 nm and a height (in direction Y-Y') of about 30-60 nm. The confined electrode 110 is shown formed in the active device region 101 (e.g., below a memory device stack), but not in a passthrough via region 103 (also referred to as a base technology or logic region).

Above the confined electrode 110, an active device stack 115 is formed as shown in FIG. 1A. The active device stack 115 represents any type of NVM device or other active device structure for which it is desirable to protect its uppermost portion (e.g., a top electrode portion) from being damaged or otherwise affected by subsequent metal hard mask processing.

FIG. 1B shows a particular example where the active device stack 115 is an RRAM device stack or pillar formed over the confined electrode 110 in the active device region 101. The RRAM device stack or pillar includes a bottom electrode 112, an insulator 114, and a top electrode 116. The bottom electrode 112 and the top electrode 116 may be formed of TiN or another suitable material such as TaN, W, tungsten nitride (WN), Ru, etc. The bottom electrode 112 and the top electrode 116 may each have a width (in direction X-X') in the range of 30-400 nm, and a height (in direction Y-Y') in the range of 20-50 nm. The insulator 114 may be formed of hafnium oxide (HfO) or another suitable material such as tantalum oxide ($Ta_2O_5$), titanium oxide ($TiO_2$), aluminum oxide ($Al_2O_3$), nickel oxide ($NiO_2$), cerium oxide ($CeO_2$), praseodymium oxide ($Pr_2O_3$), $SiO_2$, zirconium oxide ($ZrO_2$), tungsten oxide ($WO_3$), yttrium stabilized zirconia (YZT), combinations thereof, etc. The insulator 114 may have a width (in direction X-X') that matches that of the bottom electrode 112 and the top electrode 116, and may have a height (in direction Y-Y') of about 6 nm.

It should be appreciated that the RRAM stack shown in FIG. 1B is presented by way of example only, and that the active device stack 115 may comprise various other types of NVM and active device structures in other embodiments. For example, the active device stack 115 may comprise a PCM device stack, an MRAM device stack, etc.

A protection layer 118, also referred to as an etch stop layer, is formed over the active device stack 115 of FIG. 1A, or above the top electrode 116 of the RRAM device stack of FIG. 1B. The protection layer 118 may be formed of a material which may be removed selective to a material of an uppermost portion of the active device stack 115 of FIG. 1A or the top electrode 116 of the RRAM device stack of FIG. 1B. In some embodiments, the protection layer 118 is formed of TaN or another suitable material such as amorphous carbon (a-C), aluminum nitride (AlN), WN, etc. The protection layer 118 may have a width (in direction X-X') that matches that of the underlying active device stack 115 or top electrode 116, and may have a height (in direction Y-Y') of about 20 nm. An encapsulation layer 120 surrounds the bottom electrode 112, the insulator 114, the top electrode, and the protection layer 118. The encapsulation layer 120 may be formed of SiN or another suitable material such as $SiO_2$, $Al_2O_3$ or another conformal dielectric material, and may have a uniform thickness in the range of 20-60 nm.

Another ILD layer 122 is formed above the protection layer 118 and surrounding the encapsulation layer 120 as illustrated. The ILD layer 122 may be formed of materials similar to that of the ILD layer 102. The ILD layer 122 may have a width (in direction X-X') similar to that of the ILD layer 102, and may have a height (in direction Y-Y') sufficient to overfill the RRAM stack or pillar.

Vias of a first via level and contacts of a second metallization level are then formed. Trenches are formed (e.g., using damascene processing), followed by formation of liner layers 124-1 and 124-2. Metal layers 126-1, 126-2 and 128 are then filled over the liner layers 124-1 and 124-2. The metal layers 126-1 and 126-2 are part of the second metallization level, and the metal layer 128 is part of the first via level. The liner layers 124-1 and 124-2 may be formed of similar materials and with similar sizing as that of the liner layers 104-1 and 104-2. The metal layers 126-1, 126-2 and 128 may be formed of similar materials as that of the metal layers 106-1 and 106-2. The metal layer 126-1 may have a width (in direction X-X') in the range of 40-500 nm, and the metal layers 126-2 and 128 may have a width (in direction X-X') in the range of 40-120 nm. The metal layer 126-1 may be formed using dual damascene processing, allowing the metal layer 126-1 to be formed into a very long trench.

As illustrated in FIGS. 1A and 1B, the metal layer 126-1 contacts the protection layer 118 in the active device region 101. The protection layer 118 protects the active device stack 115 of FIG. 1A or the top electrode 116 of the RRAM device stack of FIG. 1B during hard mask processing used for formation of the trenches for the vias of the first via level and the contacts of the second metallization level.

Figure 2A:
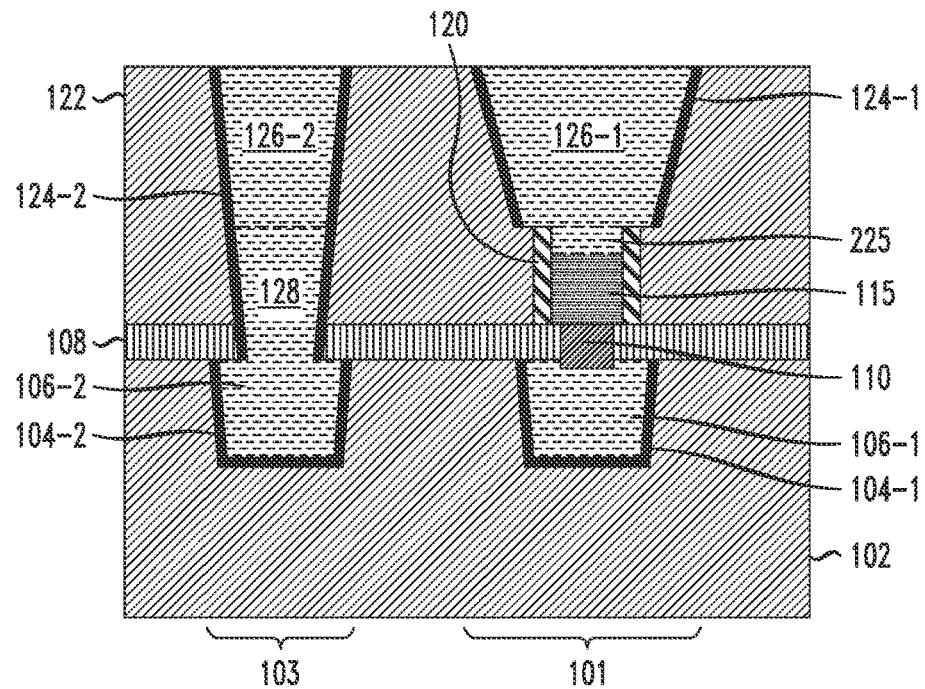
FIG. 2A depicts a cross-sectional view of a semiconductor structure including contact material formed in an area where a protection layer was formed over a top electrode of an active device pillar, the protection layer having been removed during hard mask processing used for formation of a contact to the top electrode of the active device pillar, according to an embodiment of the invention.
Figure 2B:
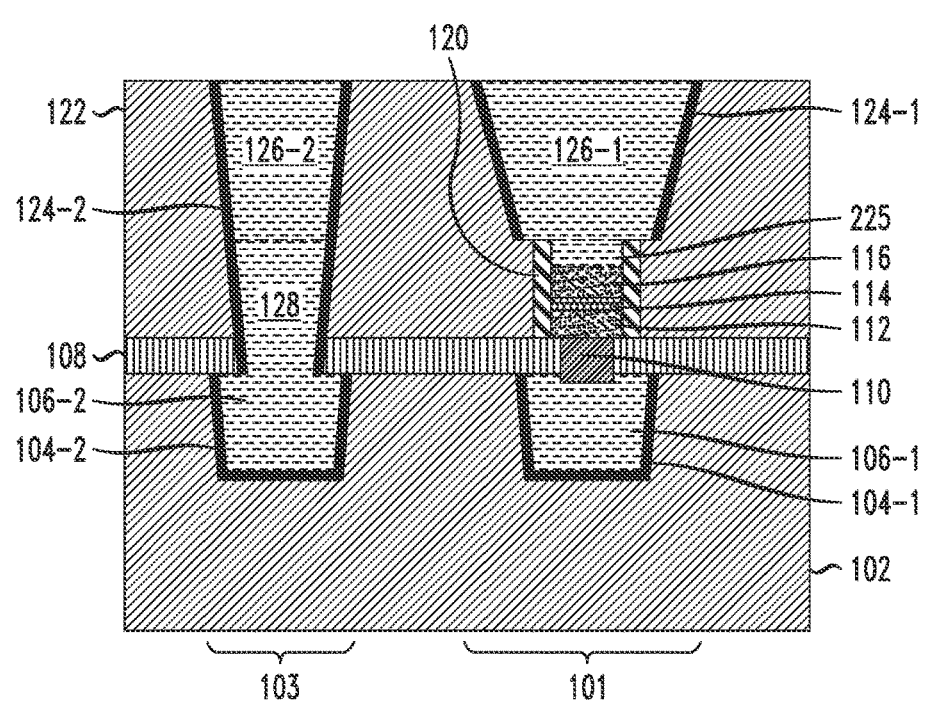
FIG. 2B depicts a cross-sectional view of a semiconductor structure including contact material formed in an area where a protection layer was formed over a top electrode of a resistive random access memory device pillar, the protection layer having been removed during hard mask processing used for formation of a contact to the top electrode of the resistive random access memory device pillar, according to an embodiment of the invention.

FIGS. 2A and 2B show respective cross-sectional views 200 and 250 of structures that are similar to that of the FIG. 1A and FIG. 1B structures, but where the protection layer 118 is removed during hard mask processing used for formation of the trenches for the vias of the first via level and the contacts of the second metallization level. A metal layer 225, formed of a material similar to that of the metal layer 126-1, is formed over the active device stack 115 of FIG. 1A or the top electrode 116 of FIG. 1B in the area where the protection layer 118 was formed.

FIGS. 3-29 illustrate processing for forming the RRAM device stack structures of FIGS. 1B and 2B. Similar processing may be used for forming other types of NVM device stack or other active device structures, such as PCM device stack structures, MRAM device stack structures, etc.

FIG. 3 shows a cross-sectional view 300 of a structure including the ILD layer 102, liner layers 104-1 and 104-2, and metal layers 106-1 and 106-2. FIG. 3 further illustrates the active device region 101 (e.g., a memory region), the passthrough via region 103 (also referred to as the base technology or logic region), a first alignment mark region 105, and a second alignment mark region 107.

FIG. 4 shows a cross-sectional view 400 of the FIG. 3 structure following formation of the capping layer 108. The capping layer 108 may be formed using any suitable deposition technique, such as chemical vapor deposition (CVD), atomic layer deposition (ALD), physical vapor deposition (PVD), etc.

Figure 5:
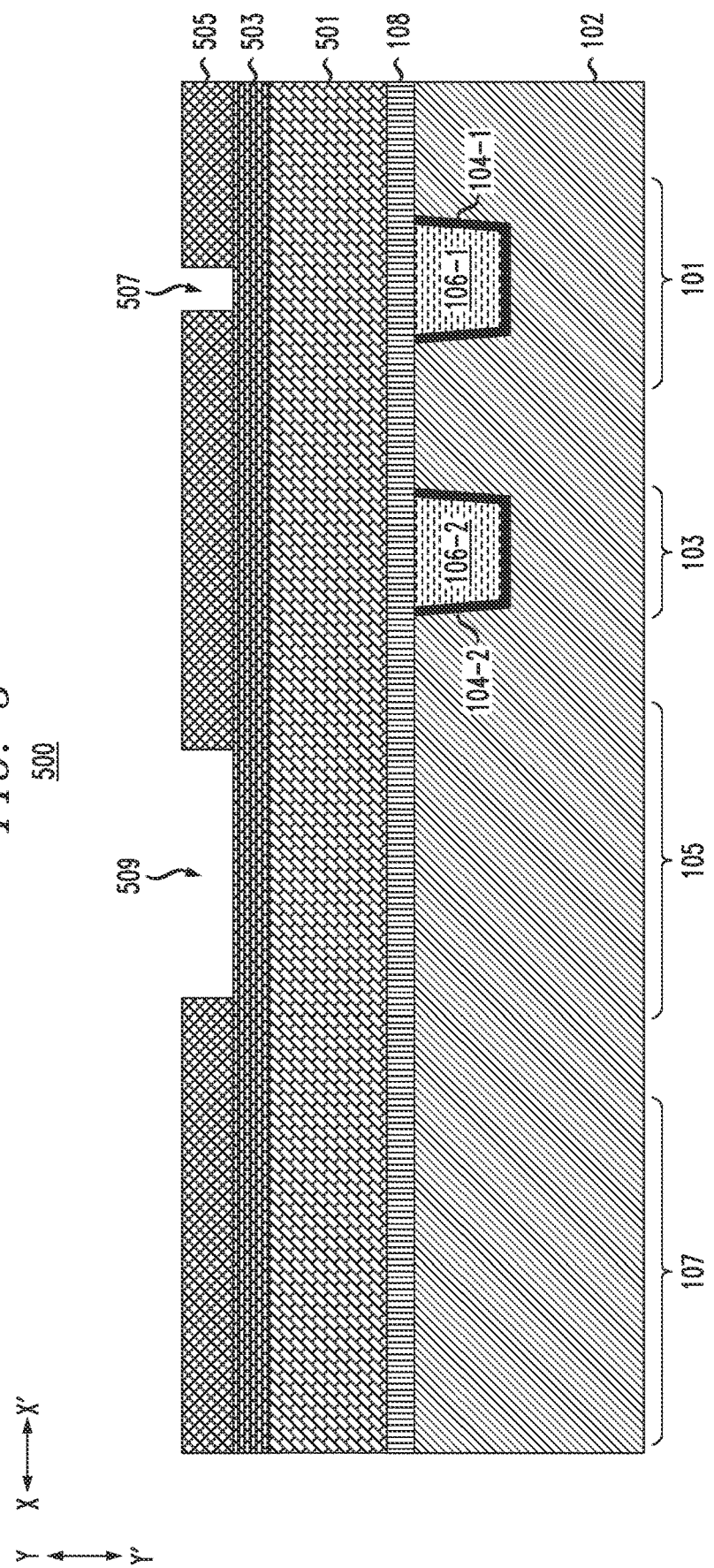
FIG. 5 depicts a cross-sectional view of the FIG. 4 structure following lithographic patterning to define first openings in a first alignment mark region and an active device region, according to an embodiment of the invention.

FIG. 5 shows a cross-sectional view 500 of the FIG. 4 structure following lithographic patterning. The lithographic patterning includes formation of an organic planarization layer (OPL) 501, a silicon anti-reflective coating (SiARC) layer 503, and a photoresist layer 505, followed by patterning of openings 507 and 509 in the photoresist layer 505. The opening 507 is aligned in the active device region 101, and the opening 509 is aligned in the first alignment mark region 105. The OPL 501 may be formed of any suitable organic planarization material, such as an organic dielectric layer (ODL), and may have a height (in direction Y-Y') of about 135 nm. The SiARC layer 503 may have a height (in direction Y-Y') that is similar to the height of the confined electrode 110. The SiARC layer 503 may have a slightly larger height (in direction Y-Y'), such as a height in the range of 30-70 nm, to account for shrinkage in downstream processing. The photoresist layer 505 may be formed of a photoresist material, and may have a height (in direction Y-Y') in the range of about 1 micrometer (μm). The opening 507 may have a width (in direction X-X') that is the same as the confined electrode 110, though the width of the opening 507 may be slightly larger (e.g., about 30-70 nm) to account for shrinkage in downstream processing, and the opening 509 may have a width (in direction X-X') in the range of 50-1000 nm.

Figure 6:
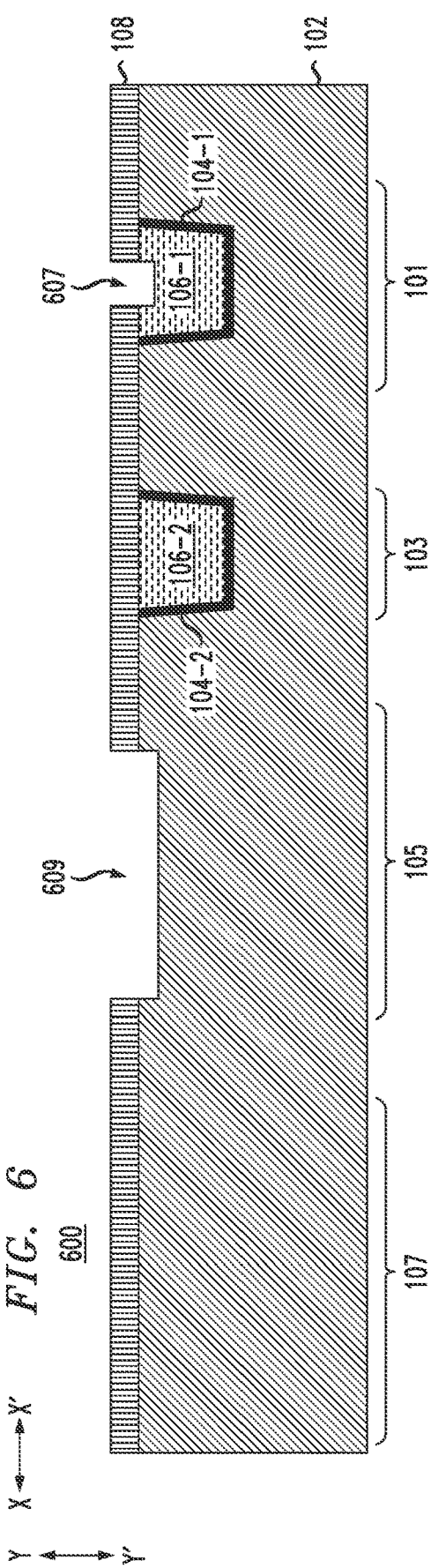
FIG. 6 depicts a cross-sectional view of the FIG. 5 structure following etching of the capping layer in the first openings, according to an embodiment of the invention.

FIG. 6 shows a cross-sectional view 600 of the FIG. 5 structure following etching of exposed portions of the SiARC layer 503, the OPL 501, and the capping layer 108 (e.g., in the openings 507 and 509). This etching may utilize a halogen containing fluorocarbons and oxygen. In some embodiments, at least a portion of the underlying metal layer 106-1 in region 607 and at least a portion of ILD layer 102 in region 609 are removed during this etch processing. Remaining portions of the OPL 501, the SiARC layer 503 and the photoresist layer 505 are then removed.

Figure 7:
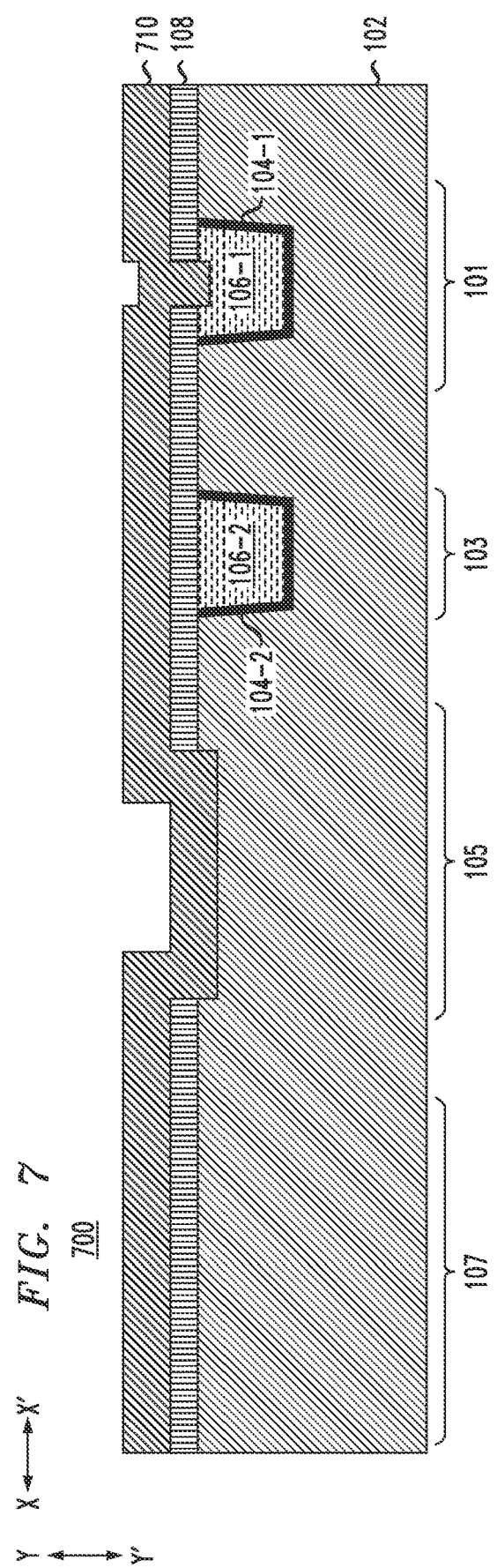
FIG. 7 depicts a cross-sectional view of the FIG. 6 structure following formation of a liner layer, according to an embodiment of the invention.

FIG. 7 shows a cross-sectional view 700 of the FIG. 6 structure following formation of a layer 710. The layer 710 may be formed using a conformal deposition process such as PVD, CVD, etc. The layer 710 may be formed of TaN or another suitable material such as TiN, a multilayer of TiN/TaN, or other metal nitrides, a single metal such as Ti, Ta, W, etc. The layer 710 may have a uniform thickness of about 50 nm.

Figure 8:
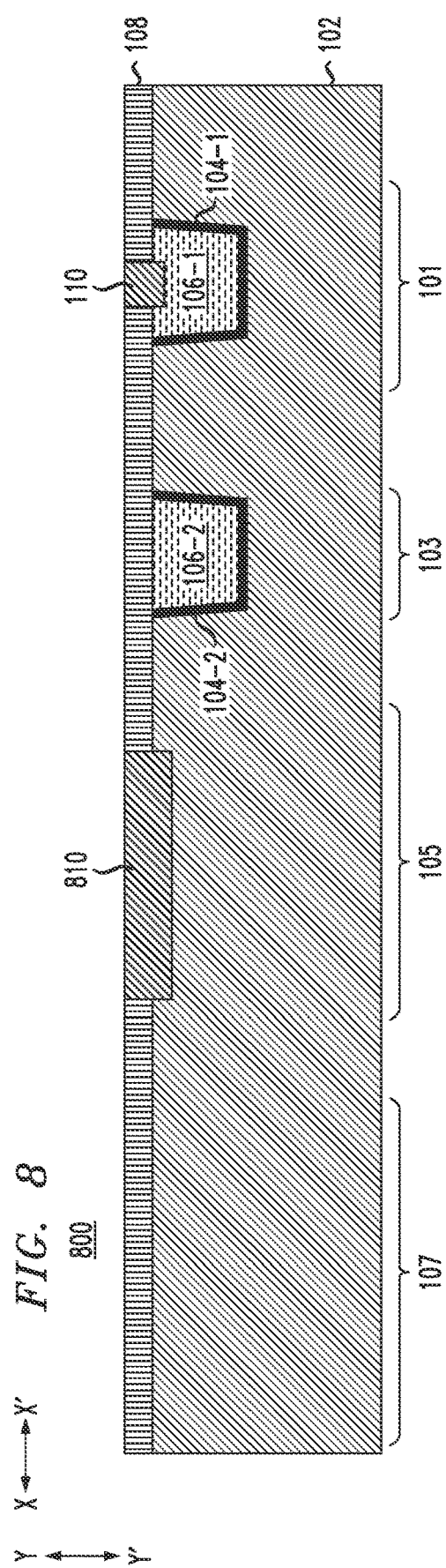
FIG. 8 depicts a cross-sectional view of the FIG. 7 structure following planarization, according to an embodiment of the invention.

FIG. 8 shows a cross-sectional view 800 of the FIG. 7 structure following planarization (e.g., using chemical mechanical planarization (CMP)), which removes portions of the layer 710 that are above the capping layer 108. The remaining portions of the layer 710 include the confined electrode 110 formed in the active device region 101, and a layer 810 in the first alignment mark region 105. The layer 810 may have a width (in direction X-X') that matches the width of the opening 509.

Figure 9:
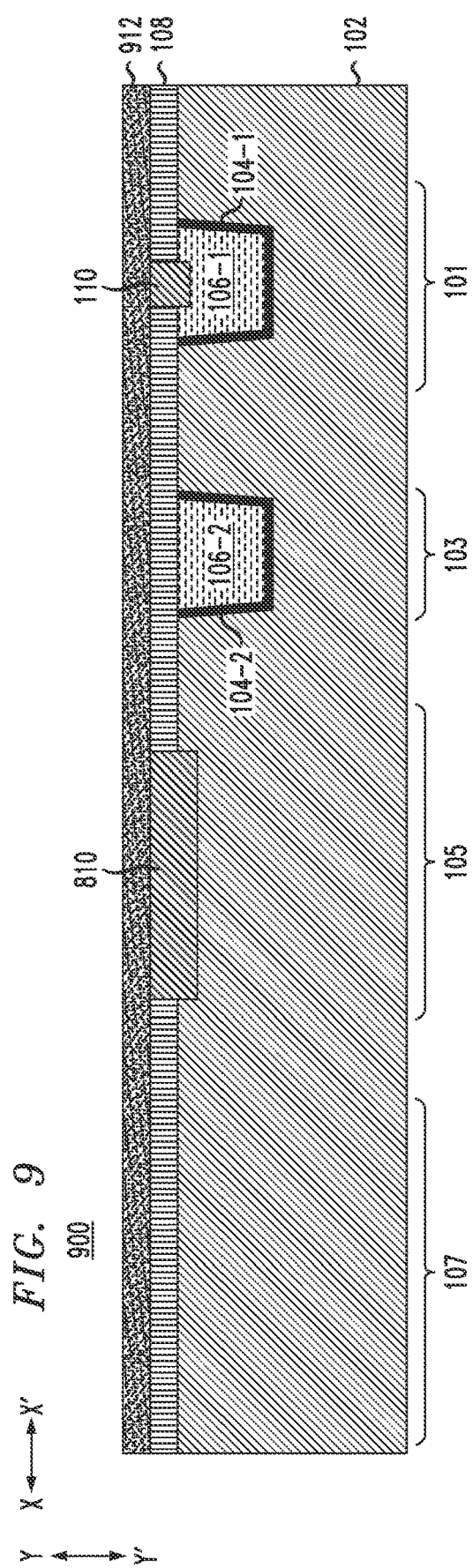
FIG. 9 depicts a cross-sectional view of the FIG. 8 structure following formation of a bottom electrode material, according to an embodiment of the invention.

FIG. 9 shows a cross-sectional view 900 of the FIG. 8 structure following formation of a bottom electrode material 912. The bottom electrode material 912 may comprise TiN or another suitable material such as TaN, W, WN, Ru, etc. The bottom electrode material 912 may have a height (in direction Y-Y') of about 25 nm. The bottom electrode material 912 may be formed using any suitable deposition process.

Figure 10:
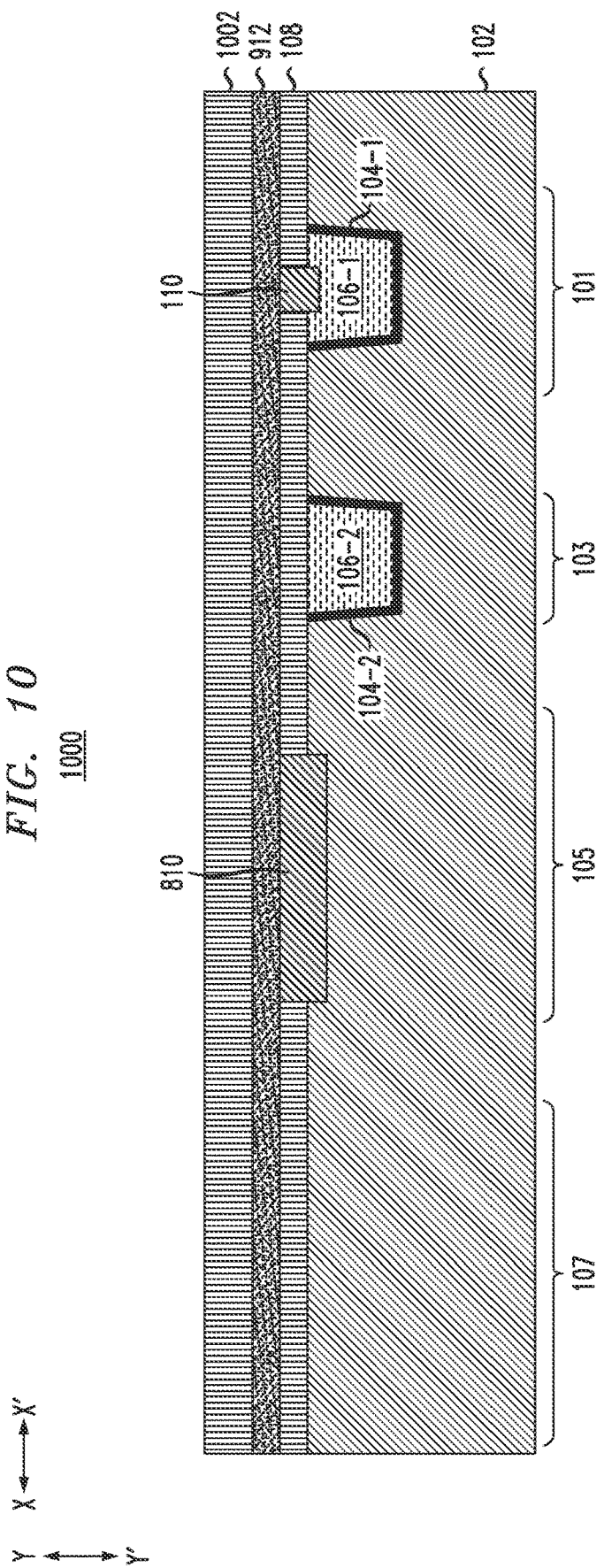
FIG. 10 depicts a cross-sectional view of the FIG. 9 structure following formation of an alignment mark material, according to an embodiment of the invention.

FIG. 10 shows a cross-sectional view 1000 of the FIG. 9 structure following formation of an alignment mark material 1002. The alignment mark material 1002 may comprise SiN or another suitable material such as a metal or dielectric material such as TiN, W, SiO$_2$, etc. The alignment mark material 1002 may have a height (in direction Y-Y') of about 45 nm.

Figure 11:
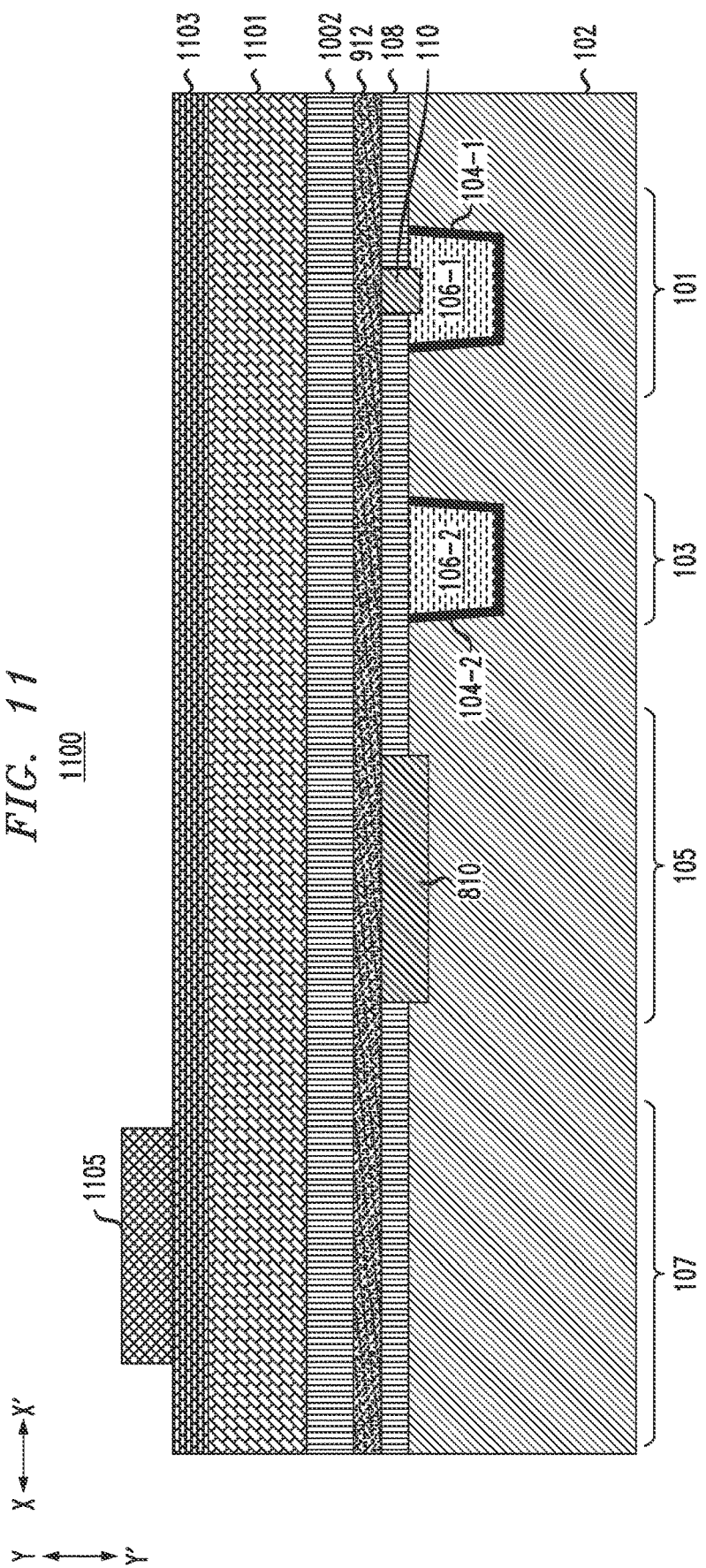
FIG. 11 depicts a cross-sectional view of the FIG. 10 structure following lithographic patterning to define a mask over a second alignment mark region, according to an embodiment of the invention.

FIG. 11 shows a cross-sectional view 1100 of the FIG. 10 structure following lithographic patterning. The lithographic patterning includes formation of an OPL 1101, a SiARC layer 1103, and a photoresist layer 1105. The photoresist layer 1105 is patterned such that it remains only over a portion of the second alignment mark region 107 as illustrated. The OPL 1101, SiARC layer 1103 and photoresist layer 1105 may be formed of similar materials and with similar sizing as that of the OPL 501, the SiARC layer 503 and the photoresist layer 505.

Figure 12:
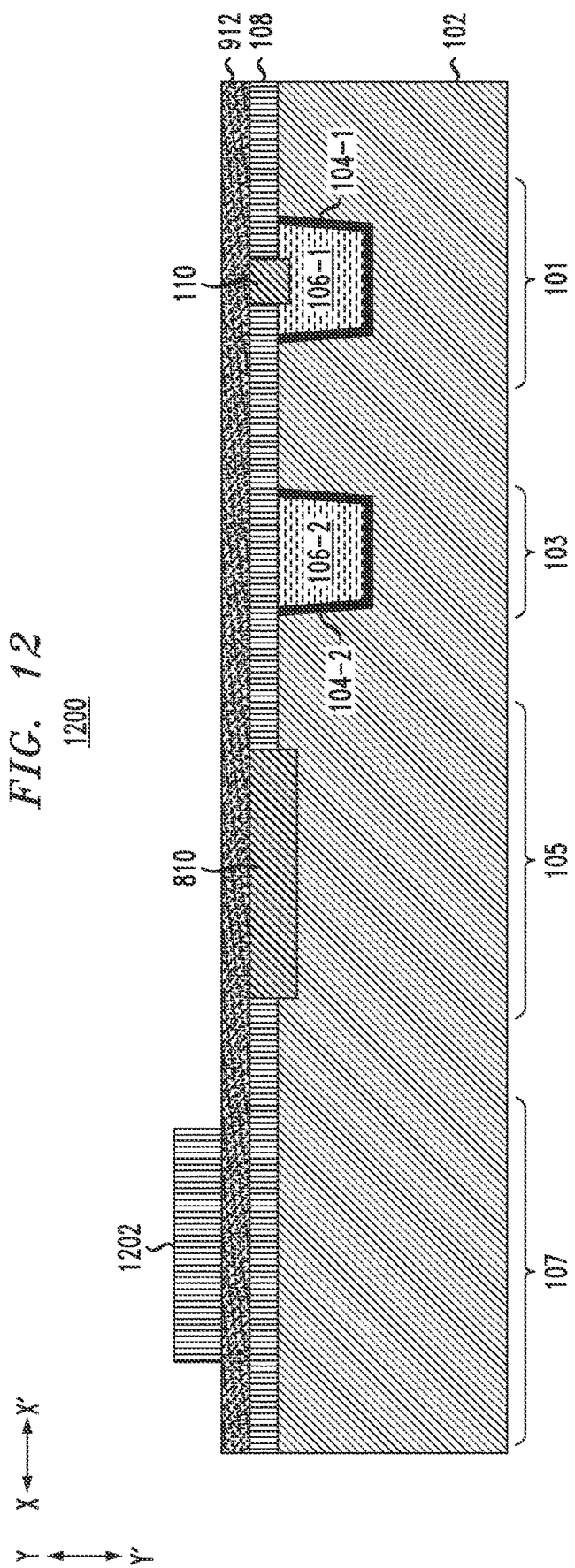
FIG. 12 depicts a cross-sectional view of the FIG. 11 structure following etching of exposed portions of the alignment mark material, according to an embodiment of the invention.

FIG. 12 shows a cross-sectional view 1200 of the FIG. 11 structure following etching of exposed portions of the alignment mark material 1002, such that only alignment mark material 1202 remains below where the photoresist layer 1105 was patterned. Remaining portions of the OPL 1101, SiARC layer 1103 and photoresist layer 1105 are then removed.

Figure 13:
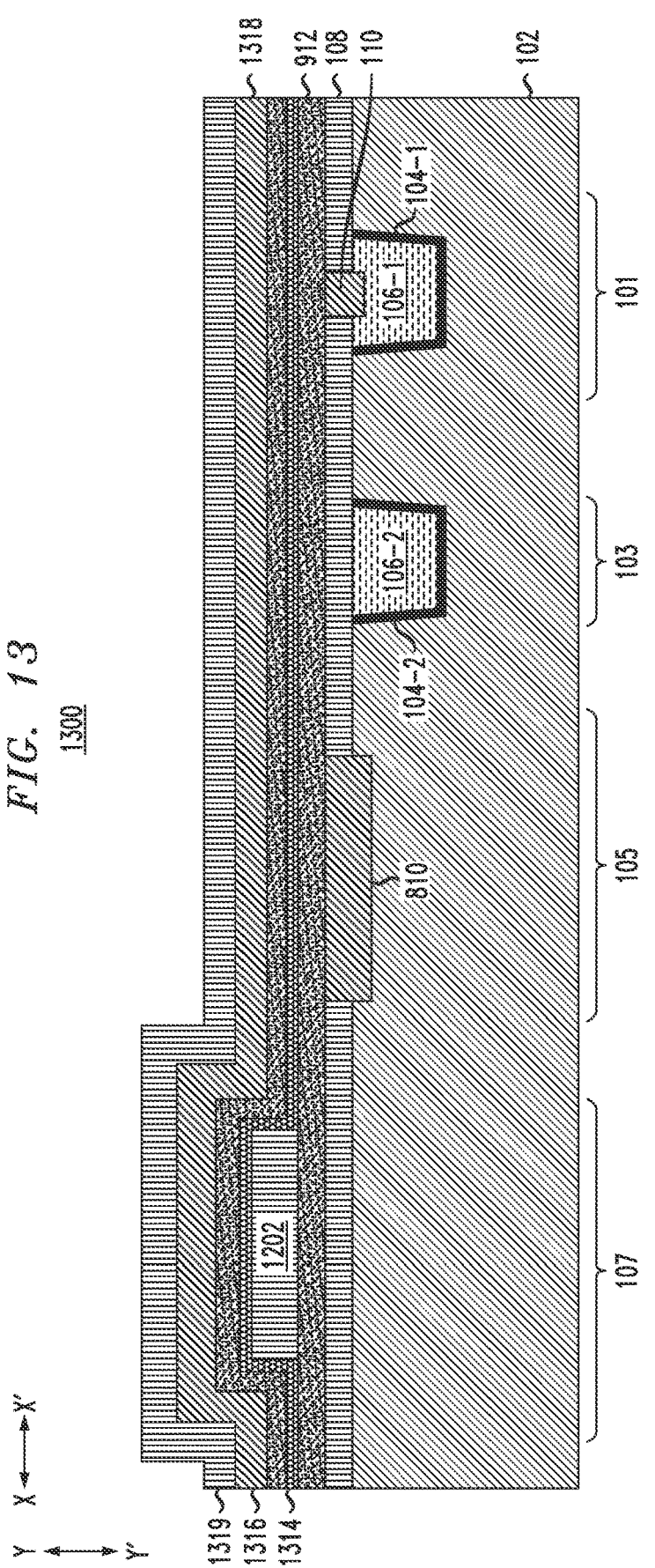
FIG. 13 depicts a cross-sectional view of the FIG. 12 structure following formation of an active device stack including an insulator material, a top electrode material, a protection layer material, and another liner material, according to an embodiment of the invention.

FIG. 13 shows a cross-sectional view 1300 of the FIG. 12 structure following formation of an active device stack (e.g., an RRAM stack or pillar), where the active device stack includes an insulator material 1314, a top electrode material 1316, a protection layer material 1318, and liner material 1319. The insulator material 1314 may be formed of HfO or another suitable insulating material, and may have a uniform thickness of about 6 nm. The top electrode material 1316 may be formed of TiN or another suitable material, and may have a uniform thickness of about 15-20 nm. The protection layer material 1318 may be formed of TaN or another suitable material (e.g., which may be etched selective to the top electrode material 1316), and may have a uniform thickness of about 20 nm. The liner material 1319 may be formed of SiN or another suitable material, and may have a thickness of about 35 nm. The insulator material 1314, the top electrode material 1316, the protection layer material 1318, and the liner material 1319 may be formed using any suitable conformal deposition processing.

Figure 14:
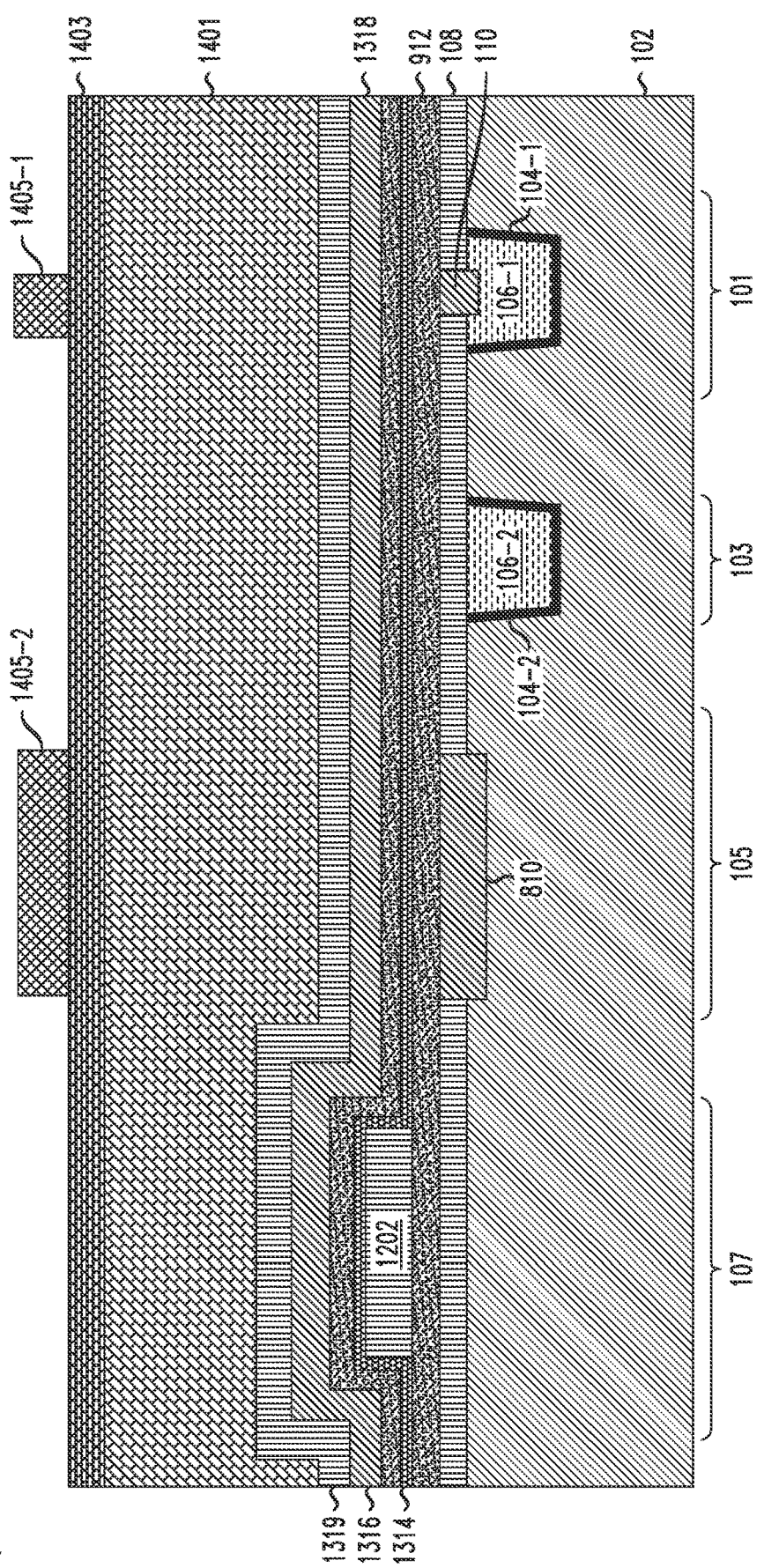
FIG. 14 depicts a cross-sectional view of the FIG. 13 structure following lithographic patterning to define masks over the first alignment mark region and the active device region, according to an embodiment of the invention.

FIG. 14 shows a cross-sectional view 1400 of the FIG. 13 structure following lithographic patterning. The lithographic patterning includes formation of an OPL 1401, a SiARC layer 1403, and a photoresist layer including photoresist layer portions 1405-1 and 1405-2. The photoresist layer is patterned such that it remains only over a portion of the active device region 101 (e.g., photoresist layer portion 1405-1) and the first alignment mark region 105 (e.g., photoresist layer 1405-2) as illustrated. The OPL 1401, SiARC layer 1403 and photoresist layer portions 1405-1 and 1405-2 may be formed of similar materials and with similar sizing as that of the OPL 501, the SiARC layer 503 and the photoresist layer 505.

Figure 15:
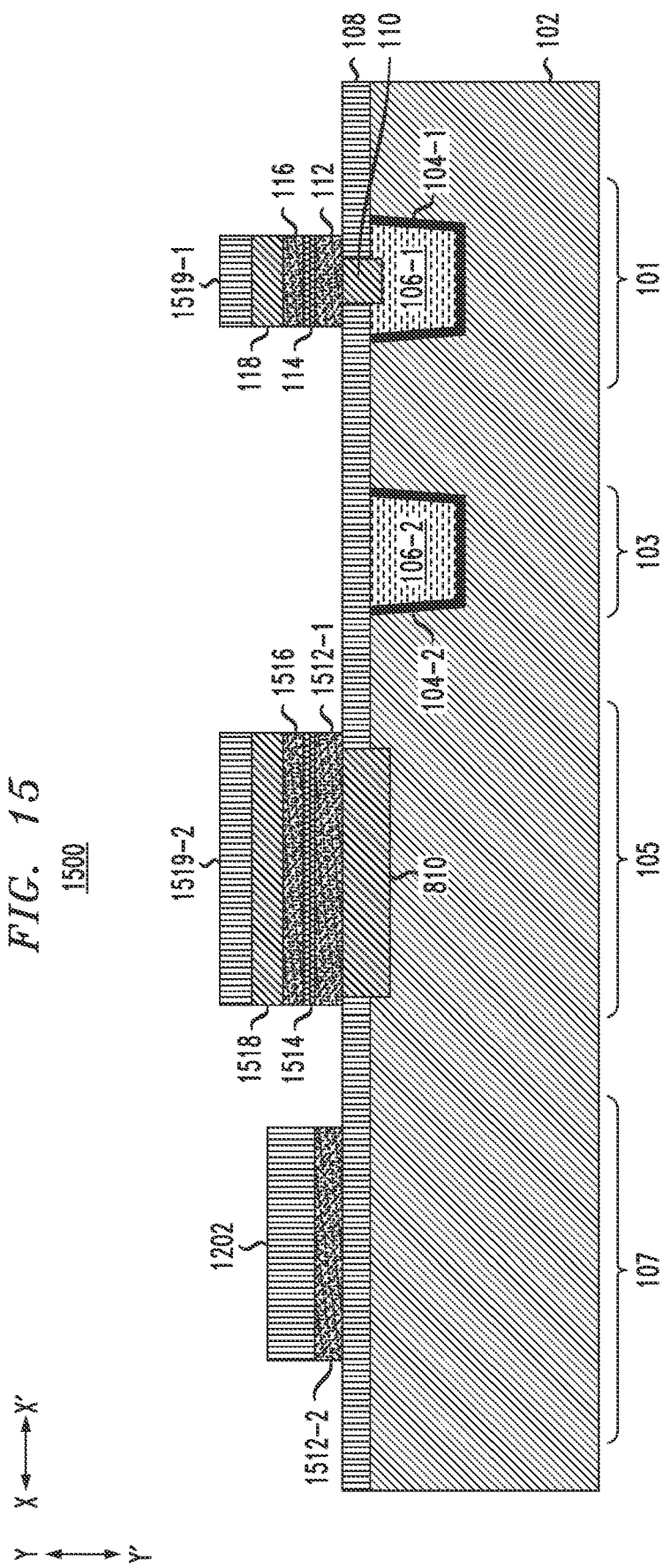
FIG. 15 depicts a cross-sectional view of the FIG. 14 structure following etching of exposed portions of the active device stack, according to an embodiment of the invention.

FIG. 15 shows a cross-sectional view 1500 of the FIG. 14 structure following etching of portions of the active device stack that are left exposed by the photoresist layer portions 1405-1 and 1405-2. This etching may utilize reactive-ion etching (RIE), ion beam etching, etc. Thus, in the active device region 101 there is an active device stack or pillar including the bottom electrode 112, insulator 114, top electrode 116, protection layer 118, and liner 1519-1. In the first alignment mark region 105, there is bottom electrode material 1512-1, insulator material 1514, top electrode material 1516, protection layer material 1518, and liner 1519-2. In the second alignment mark region 107, there is bottom electrode material 1512-2 and the alignment mark material 1202.

Figure 16:
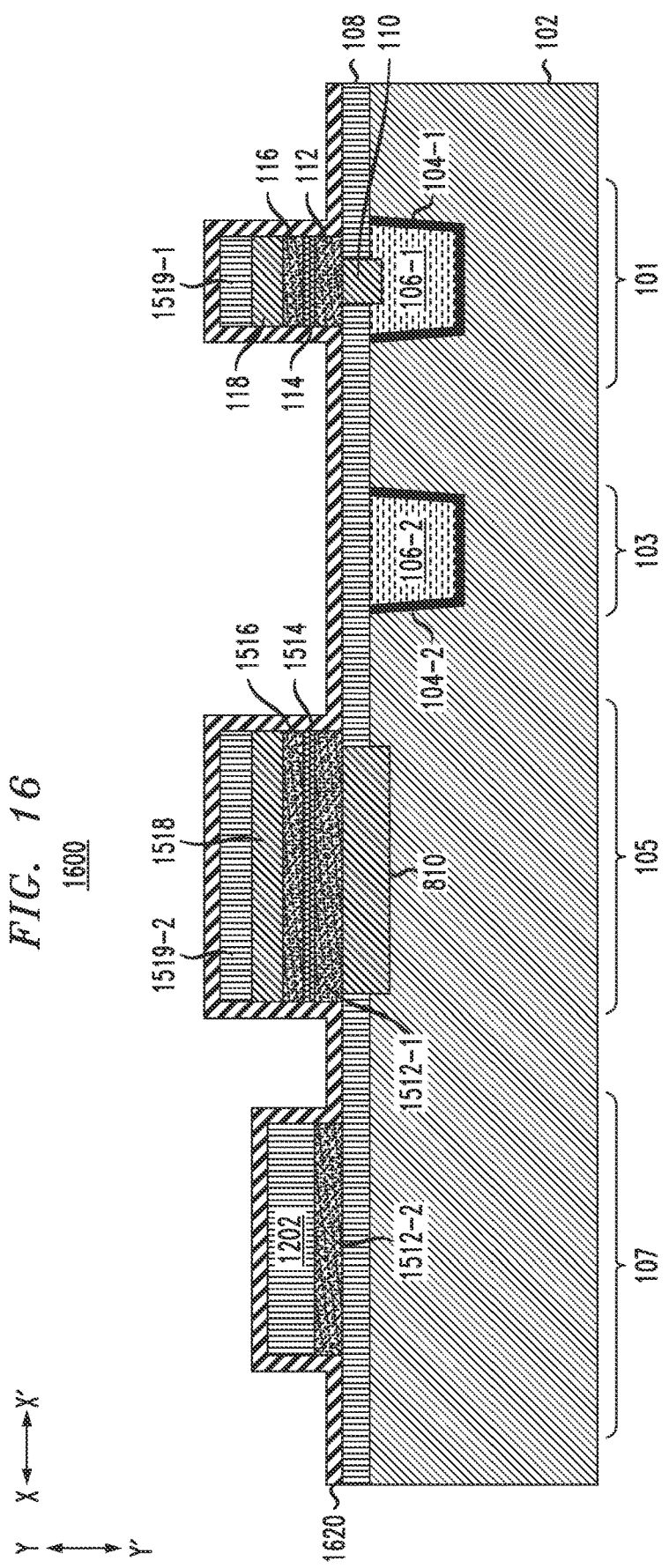
FIG. 16 depicts a cross-sectional view of the FIG. 15 structure following formation of an encapsulation layer, according to an embodiment of the invention.

FIG. 16 shows a cross-sectional view 1600 of the FIG. 15 structure following formation of an encapsulation material 1620. The encapsulation material 1620 may be formed using a conformal deposition process such as CVD, ALD, etc. The encapsulation material 1620 may be formed of SiN or another suitable material such as SiO$_2$, Al$_2$O$_3$ or another conformal dielectric material. The encapsulation material 1620 may have a uniform thickness in the range of 20-60 nm.

Figure 17:
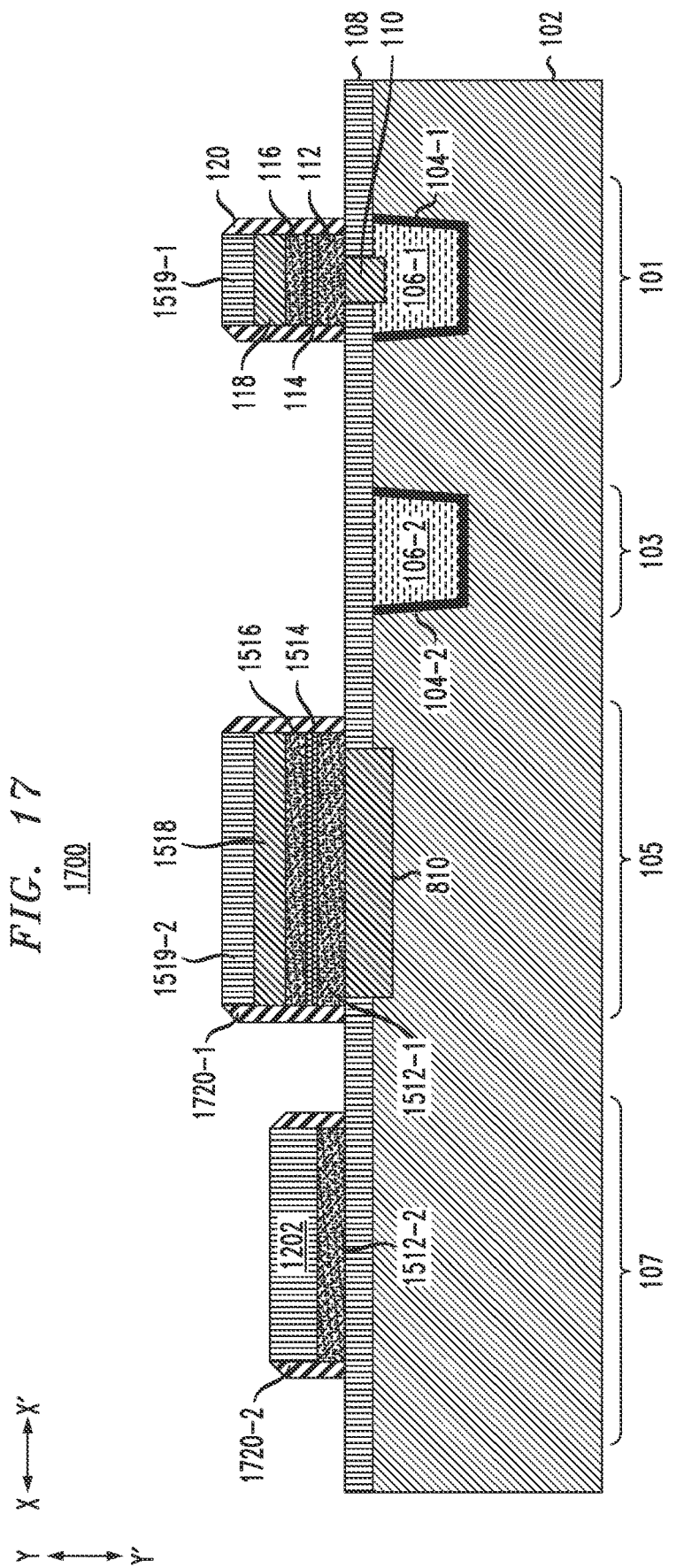
FIG. 17 depicts a cross-sectional view of the FIG. 16 structure following etching of portions of the encapsulation layer, according to an embodiment of the invention.

FIG. 17 shows a cross-sectional view 1700 of the FIG. 16 structure following etching of portions of the encapsulation material 1620. This etching may utilize reactive-ion etching (RIE). As a result of the RIE, the encapsulation material 1620 remains only on: sidewalls of the active device stack (e.g., encapsulation layer 120); sidewalls of the bottom electrode material 1512-1, insulator material 1514, top electrode material 1516, protection material 1518, and liner 1519-2 (e.g., encapsulation layer 1720-1); and sidewalls of the bottom electrode material 1512-2 and alignment mark material 1202 (e.g., encapsulation layer 1720-2).

Figure 18:
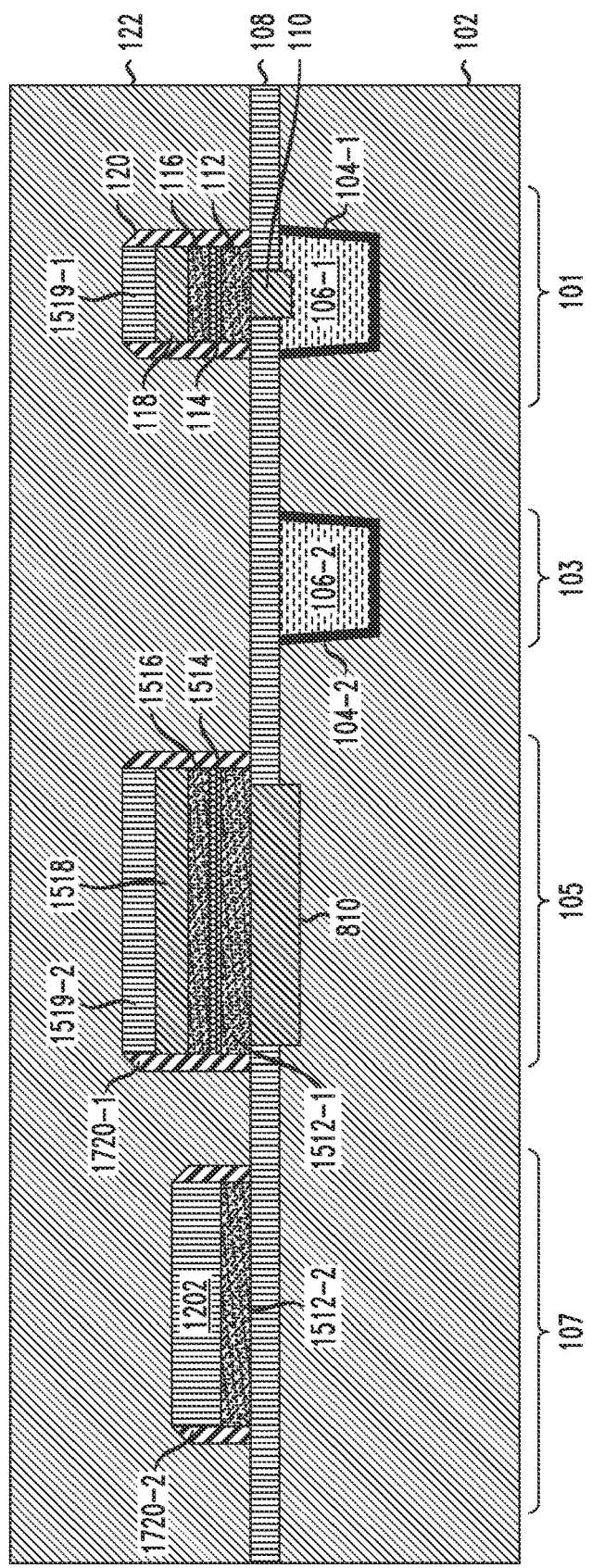
FIG. 18 depicts a cross-sectional view of the FIG. 17 structure following formation of another interlevel dielectric layer, according to an embodiment of the invention.

FIG. 18 shows a cross-sectional view 1800 of the FIG. 17 structure following formation of ILD layer 122. The ILD layer 122 may be formed through deposition of an ILD material followed by planarization (e.g., using CMP). The ILD layer 122 may be formed of similar materials as the ILD layer 102. The ILD layer 122 may have a height (in direction Y-Y') which overfills the underlying structures.

From the FIG. 18 structure, separate processes may be used to form the structure of FIG. 1 and the structure of FIG. 2. FIGS. 19-23 illustrate a process for forming the FIG. 1 structure from the FIG. 18 structure, and FIGS. 24-29 illustrate a process for forming the FIG. 2 structure from the FIG. 18 structure.

Figure 19:
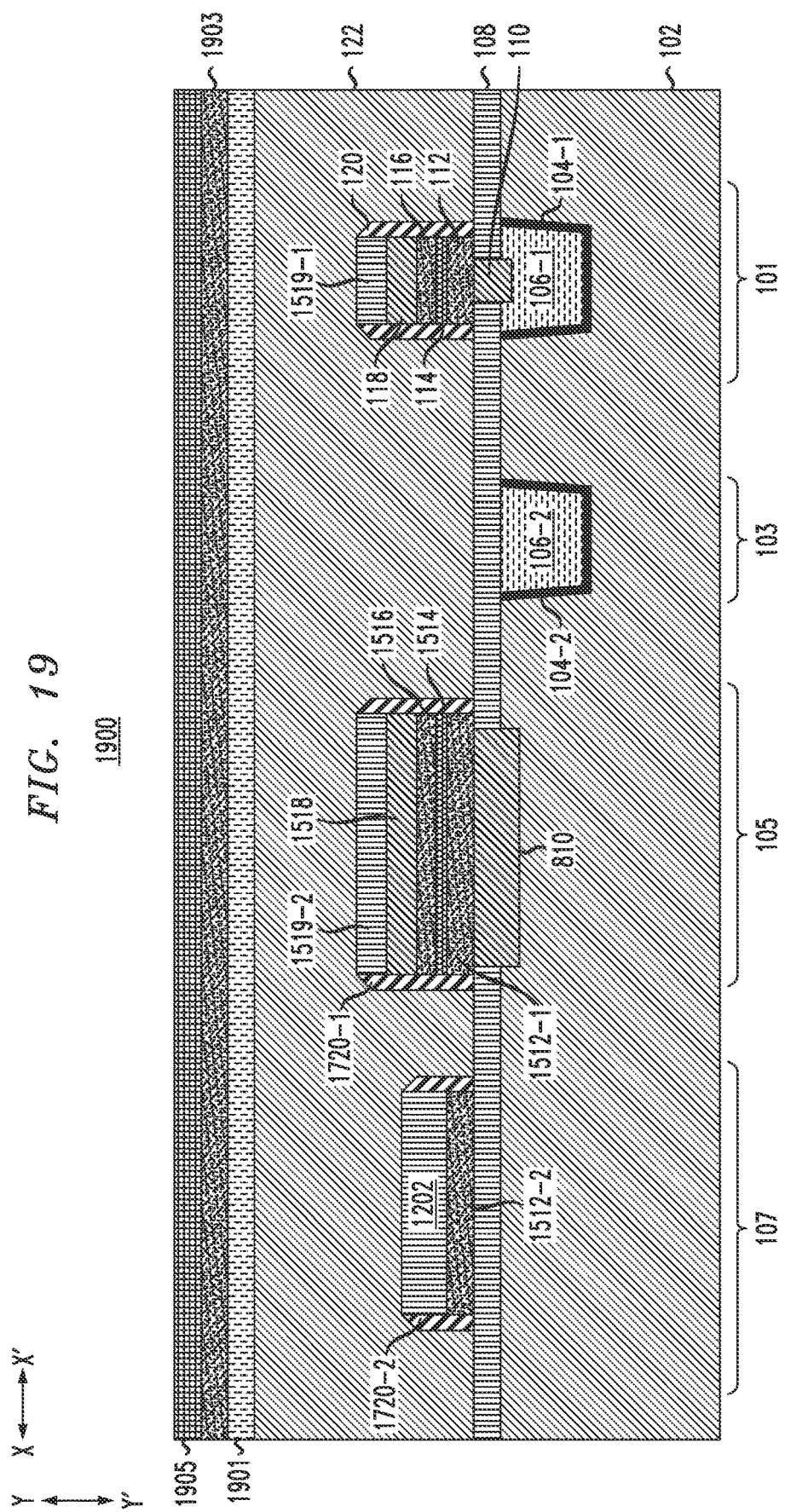
FIG. 19 depicts a cross-sectional view of the FIG. 18 structure following formation of a hard mask stack including a hard mask material that is the same as a material of the top electrode of the active device stack, according to an embodiment of the invention.

FIG. 19 shows a cross-sectional view 1900 of the FIG. 18 structure following formation of a hard mask stack including a first hard mask stack layer 1901, a second hard mask stack layer 1903 and a third hard mask stack layer 1905. The first hard mask stack layer 1901 may be formed of sacrificial SiN (SacSiN), and may have a height (in direction Y-Y') in the range of 10-100 nm. A SacSiN material may be formed using a fast deposition process with nitrogen (N) poor stoichiometry which is more porous than other types of SiN materials. SacSiN is easily removed using a DHF etch. The second hard mask stack layer 1903 may be formed of the same material as the protection layer 118 (e.g., TaN), and may have a height (in direction Y-Y') in the range of 10-50 nm. The third hard mask stack layer 1905 may be formed of TEOS or another suitable material, and may have a height (in direction Y-Y') in the range of 50-300 nm.

Figure 20:
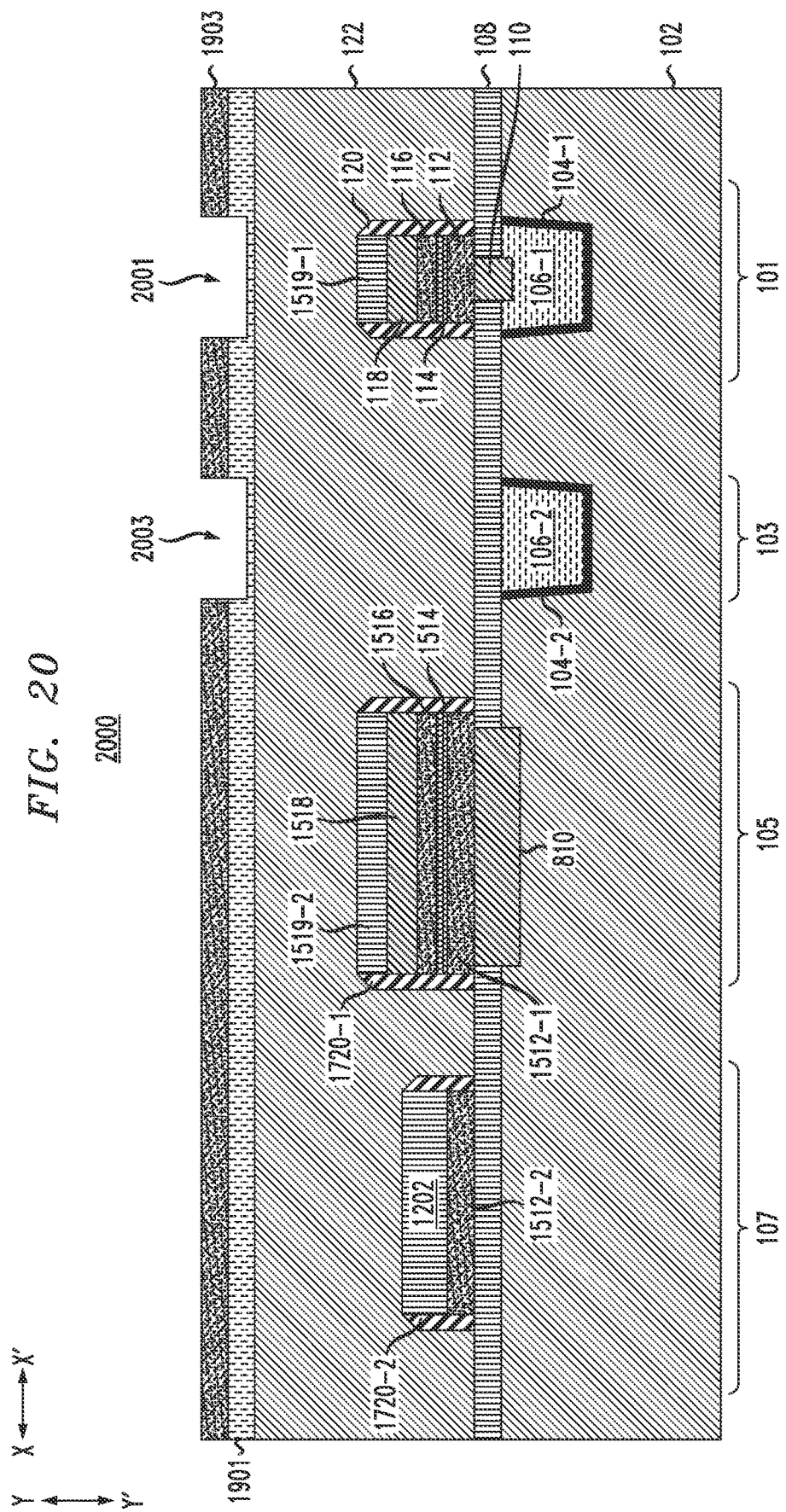
FIG. 20 depicts a cross-sectional view of the FIG. 19 structure following lithographic patterning to define openings in the hard mask stack in the active device region and a passthrough via region, according to an embodiment of the invention.

FIG. 20 shows a cross-sectional view 2000 of the FIG. 19 structure following lithographic patterning to define openings 2001 and 2003 in the second hard mask stack layer 1903 and through portions of the first hard mask stack layer 1901. The third hard mask stack layer 1905 is removed as part of the lithographic patterning that defines the openings 2001 and 2003. The opening 2001 is formed over the active device stack in the active device region 101, and the opening 2003 is formed over the metal layer 106-2 in the passthrough via region 103. The opening 2001 may have a width (in direction X-X') in the range of 40-500 nm, and the opening 2003 may have a width (in direction X-X') in the range of 40-120 nm.

Figure 21:
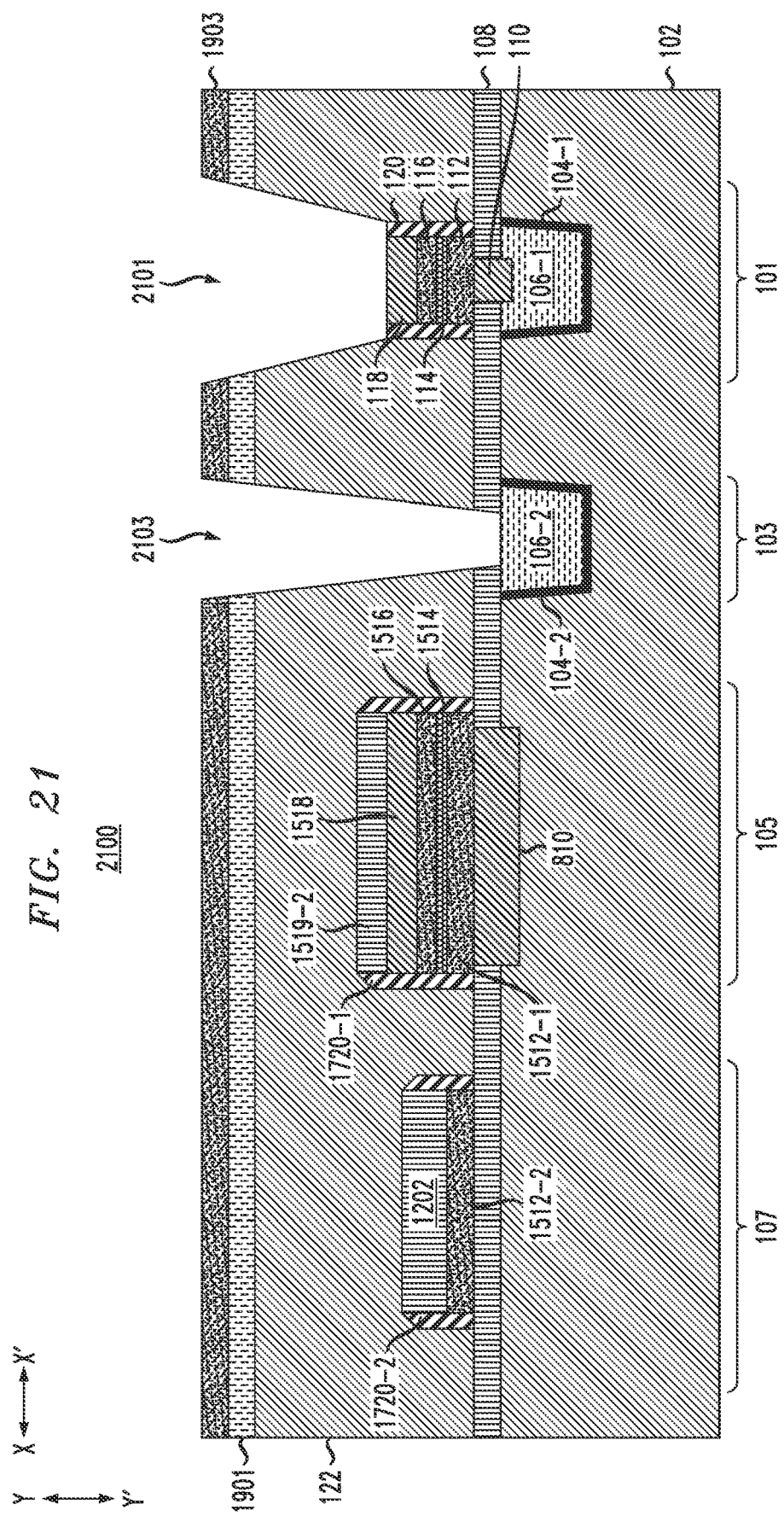
FIG. 21 depicts a cross-sectional view of the FIG. 20 structure following formation of contact and via trenches in the interlevel dielectric layer, where the protection layer provides an etch stop layer for the contact trench to the active device stack, according to an embodiment of the invention.

FIG. 21 shows a cross-sectional view 2100 of the FIG. 20 structure following formation of contact and via trenches through the ILD layer 122, including a contact trench 2101 through the opening 2001 that stops on the protection layer 118 (e.g., the etching removes the liner 1519-1, and portions of the encapsulation layer 120 formed above the protection layer 118) and a combined contact and via trench 2103 formed through the opening 2003 that etches through the capping layer 108 and exposes a portion of the metal layer 106-2.

Figure 22:
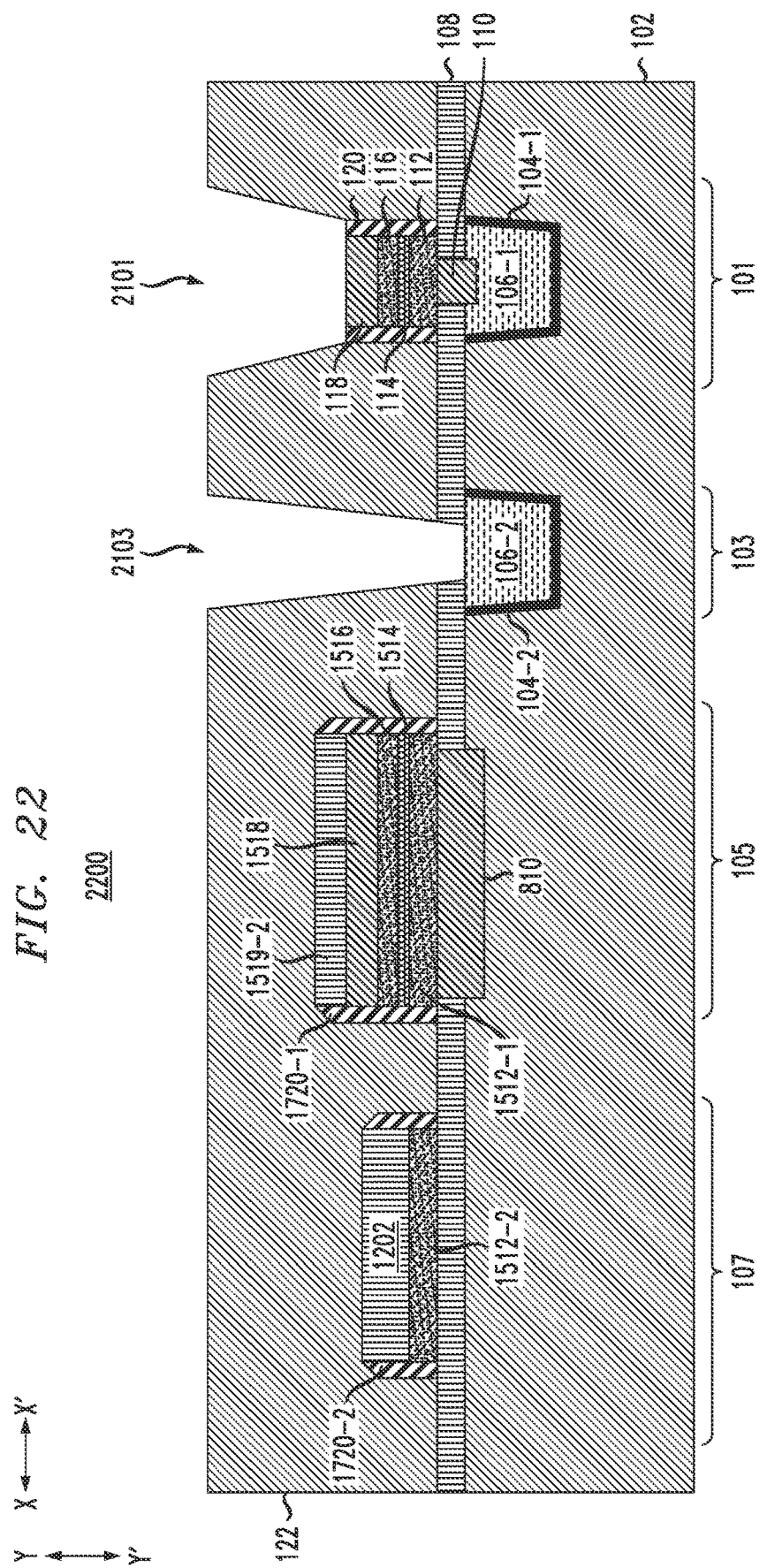
FIG. 22 depicts a cross-sectional view of the FIG. 21 structure following removal of remaining portions of the hard mask stack, according to an embodiment of the invention.

FIG. 22 shows a cross-sectional view 2200 of the FIG. 21 structure following removal of remaining portions of the hard mask stack (e.g., remaining portions of the first hard mask stack layer 1901 and the second hard mask stack layer 1903). The remaining portions of the first hard mask stack layer 1901 and the second hard mask stack layer 1903 may be removed using a wet etch chemistry, such as DHF, hydroxides, peroxides, acids, mixtures thereof, etc. It should be noted that the protection layer 118 protects the top electrode 116 during removal of the remaining portions of the first hard mask stack layer 1901 and the second hard mask stack layer 1903.

Figure 23:
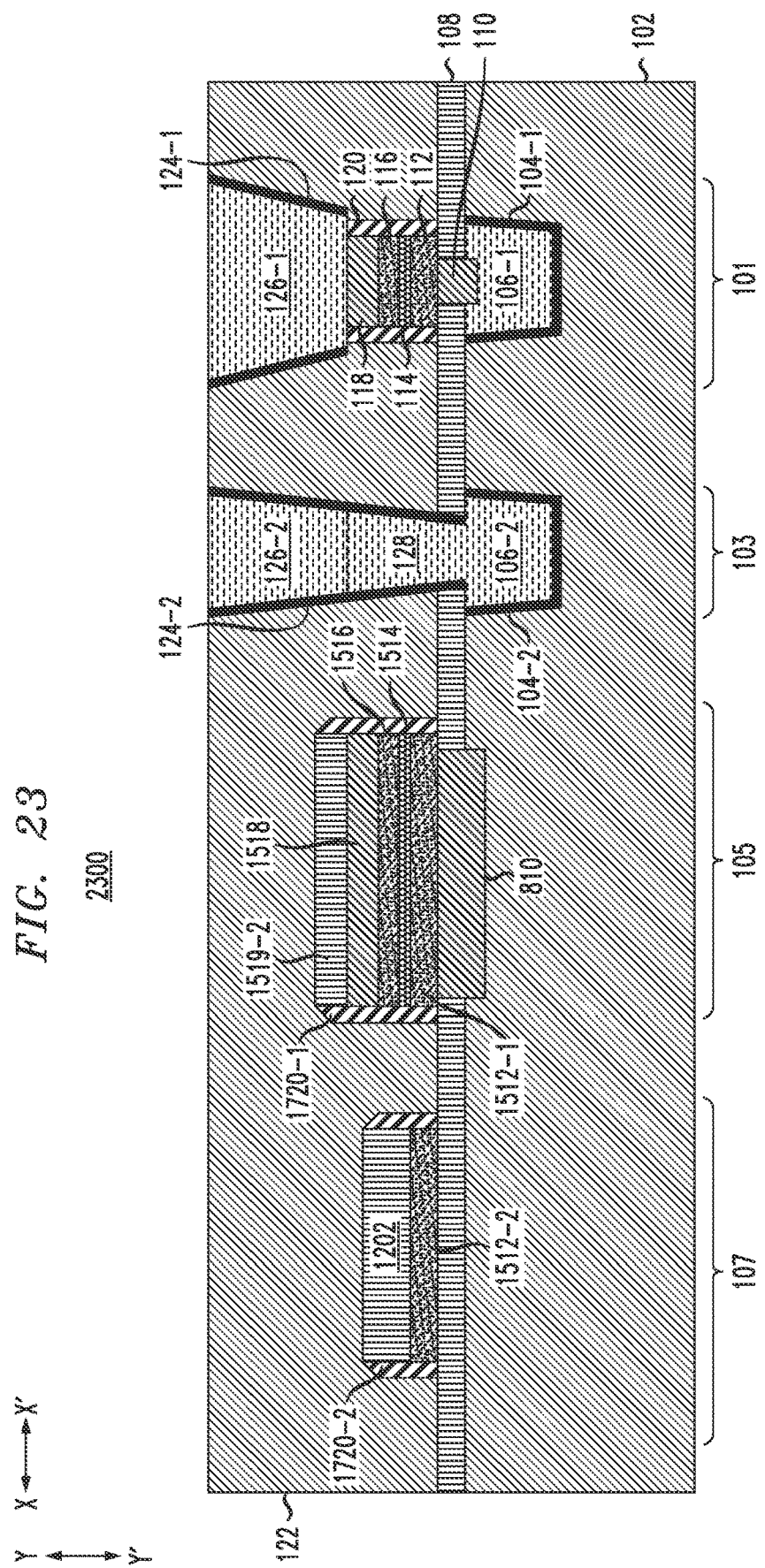
FIG. 23 depicts a cross-sectional view of the FIG. 22 structure following formation of contacts and vias in the contact and via trenches, according to an embodiment of the invention.

FIG. 23 shows a cross-sectional view 2300 of the FIG. 22 structure following formation of contacts and vias in the contact and via trenches 2101 and 2103. This includes formation of the liner layers 124-1 and 124-2, and the metal layers 126-1, 126-2 and 128.

Figure 24:
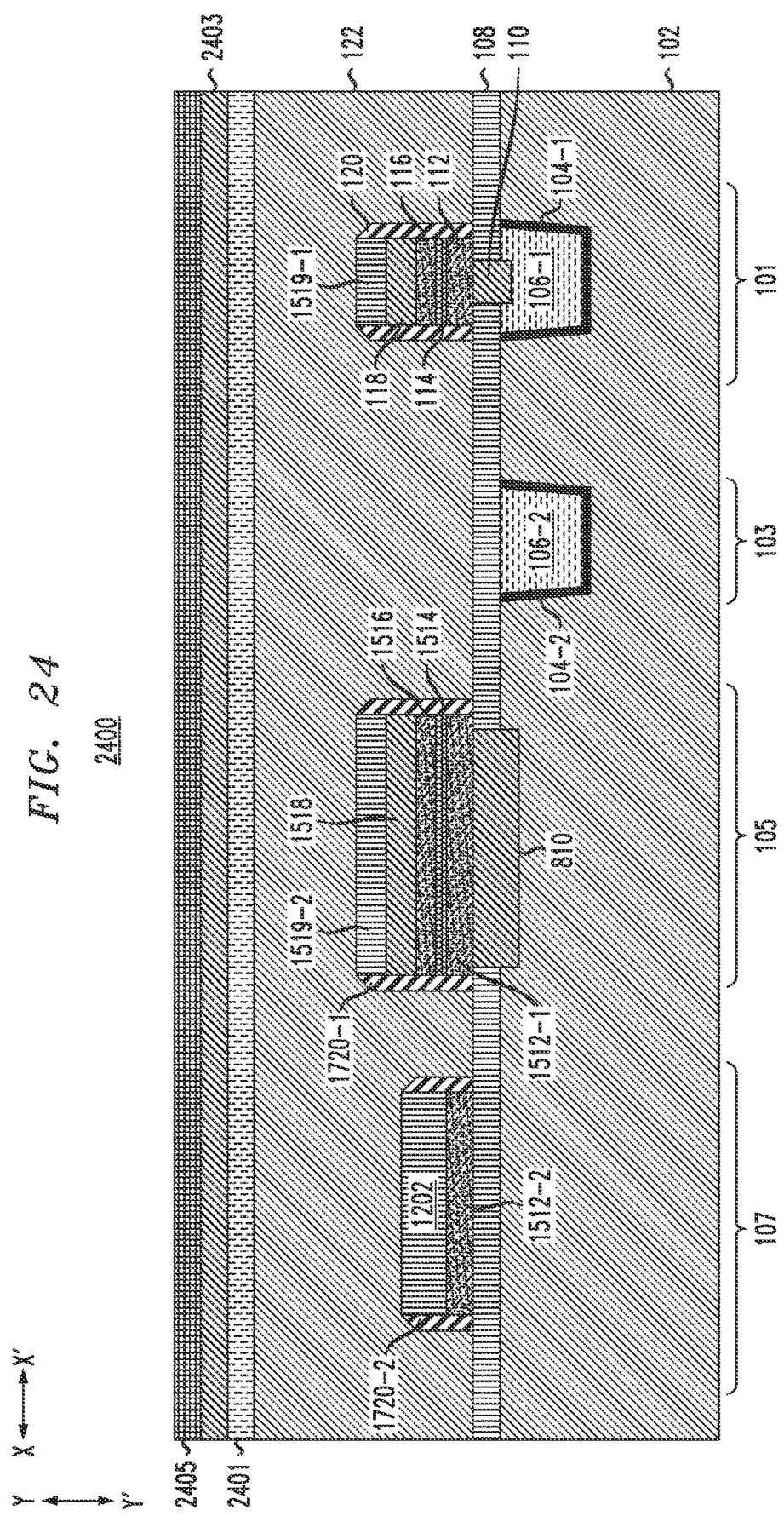
FIG. 24 depicts a cross-sectional view of the FIG. 18 structure following formation of a hard mask stack including a hard mask material that is the same as a material of the protection layer of the active device stack, according to an embodiment of the invention.

FIG. 24 shows a cross-sectional view 2400 of the FIG. 18 structure following formation of a hard mask stack including a first hard mask stack layer 2401, a second hard mask stack layer 2403 and a third hard mask stack layer 2405. The first hard mask stack layer 2401, the second hard mask stack layer 2403 and the third hard mask stack layer 2405 may be formed with similar sizing as that of the first hard mask stack layer 1901, the second hard mask stack layer 1903 and the third hard mask stack layer 1905. Further, the first hard mask stack layer 2401 and the third hard mask stack layer 2405 may be formed of similar materials as the first hard mask stack layer 1901 and the third hard mask stack layer 1905. The second hard mask stack layer 2403, however, is formed of a different material than the second hard mask stack layer 1903. More particularly, while the second hard mask stack layer 1903 is formed of a same material as the top electrode 116 (e.g., TiN), the second hard mask stack layer 2403 is formed of a same material as the protection layer 118 (e.g., TaN).

Figure 25:
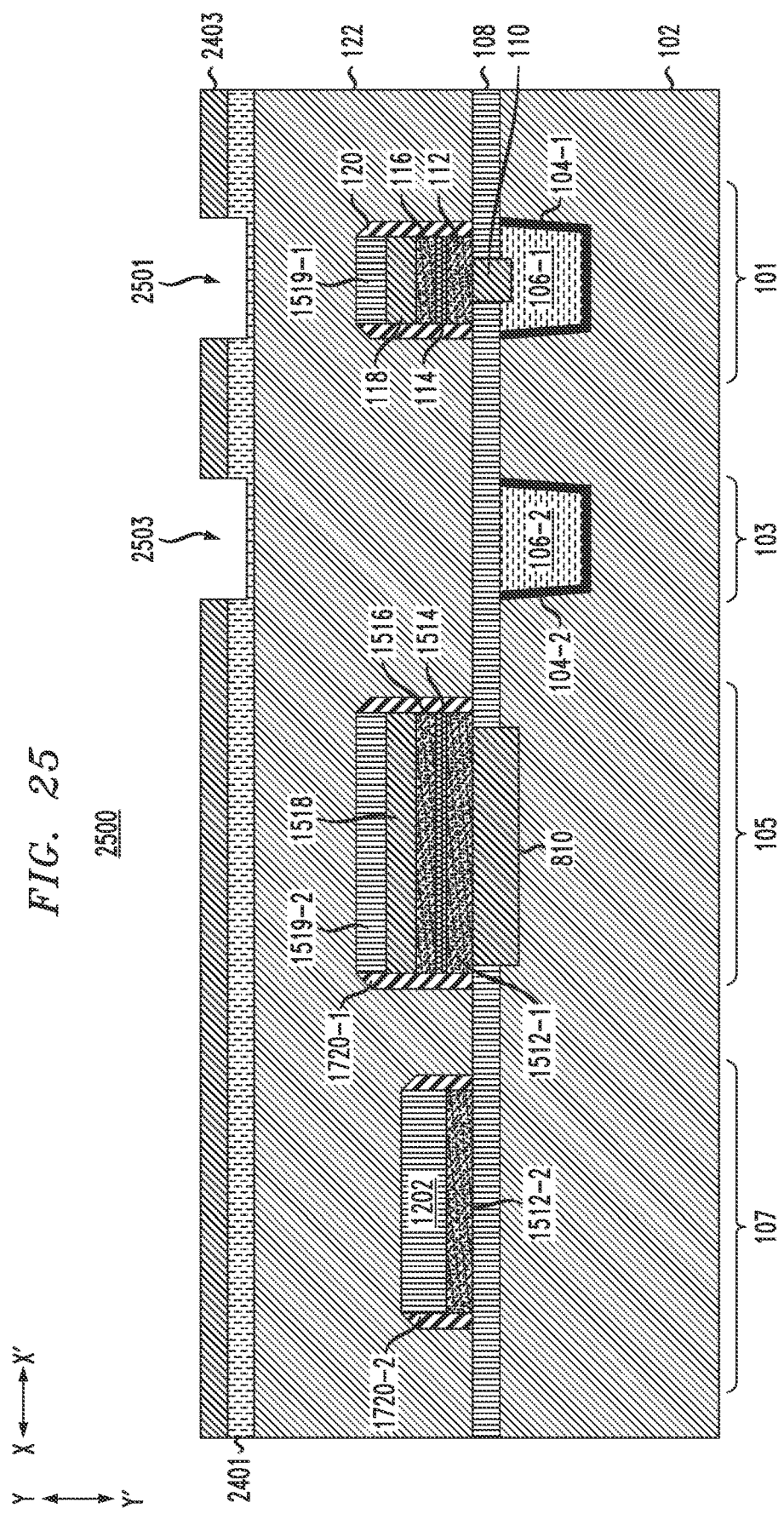
FIG. 25 depicts a cross-sectional view of the FIG. 24 structure following lithographic patterning to define openings in the hard mask stack in the active device region and the passthrough via region, according to an embodiment of the invention.

FIG. 25 shows a cross-sectional view 2500 of the FIG. 24 structure following lithographic patterning to define openings 2501 and 2503 in the second hard mask stack layer 2403 and through portions of the first hard mask stack layer 2401. The third hard mask stack layer 2405 is removed as part of the lithographic patterning that defines the openings 2501 and 2503. The opening 2501 is formed over the active device stack in the active device region 101, and the opening 2503 is formed over the metal layer 106-2 in the passthrough via region 103. The opening 2501 may have a width (in direction X-X') in the range of 40-500 nm, and the opening 2503 may have a width (in direction X-X') in the range of 40-120 nm.

Figure 26:
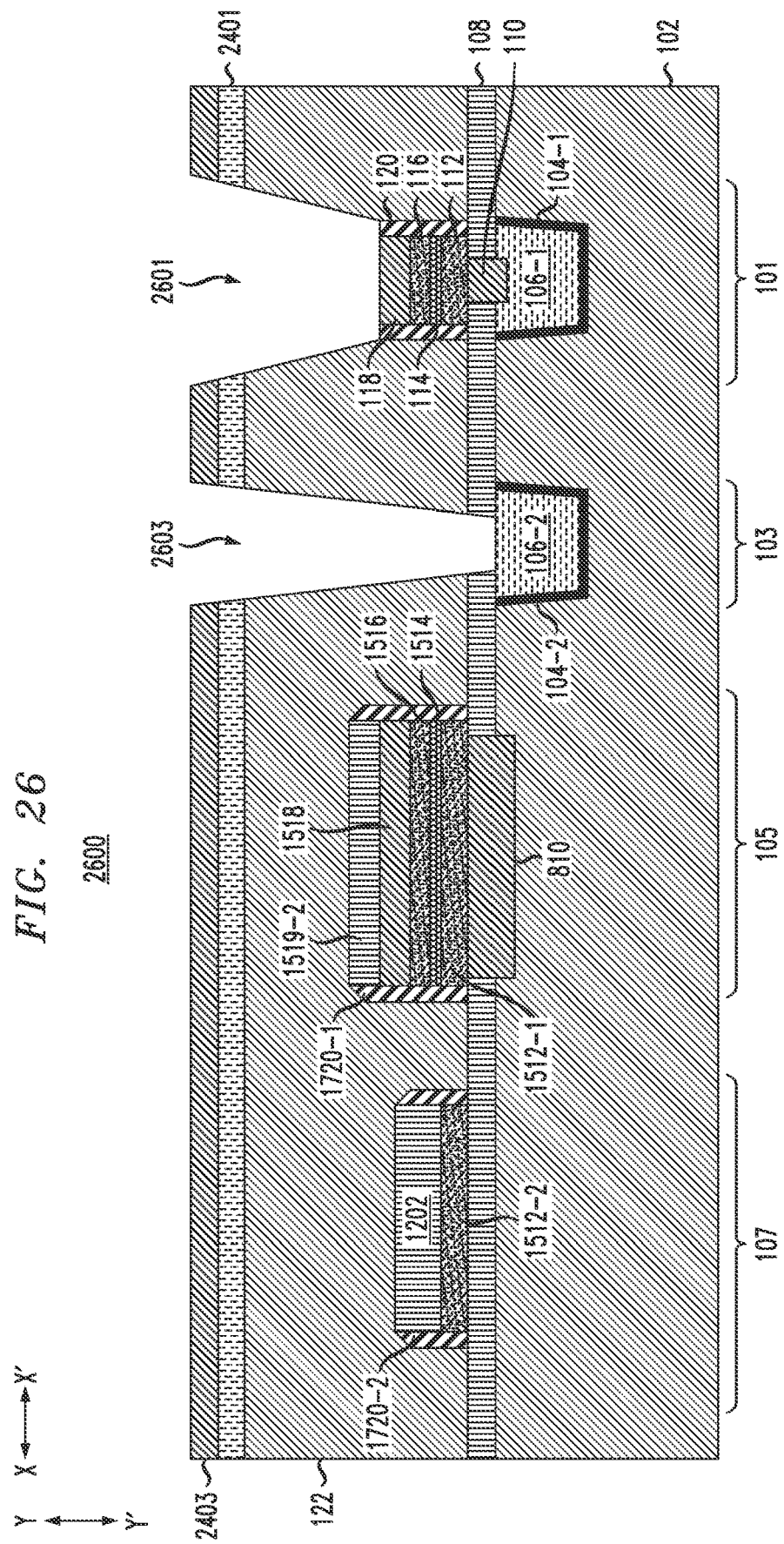
FIG. 26 depicts a cross-sectional view of the FIG. 25 structure following formation of contact and via trenches in the interlevel dielectric layer, where the protection layer provides an etch stop layer for the contact trench to the active device stack, according to an embodiment of the invention.

FIG. 26 shows a cross-sectional view 2600 of the FIG. 25 structure following formation of contact and via trenches through the ILD layer 122, including a contact trench 2601 through the opening 2501 that stops on the protection layer 118 (e.g., the etching removes the liner 1519-1 as well as portions of the encapsulation layer 120 formed above the protection layer 118) and a combined contact and via trench 2603 formed through the opening 2503 that etches through the capping layer 108 and exposes a portion of the metal layer 106-2.

Figure 27:
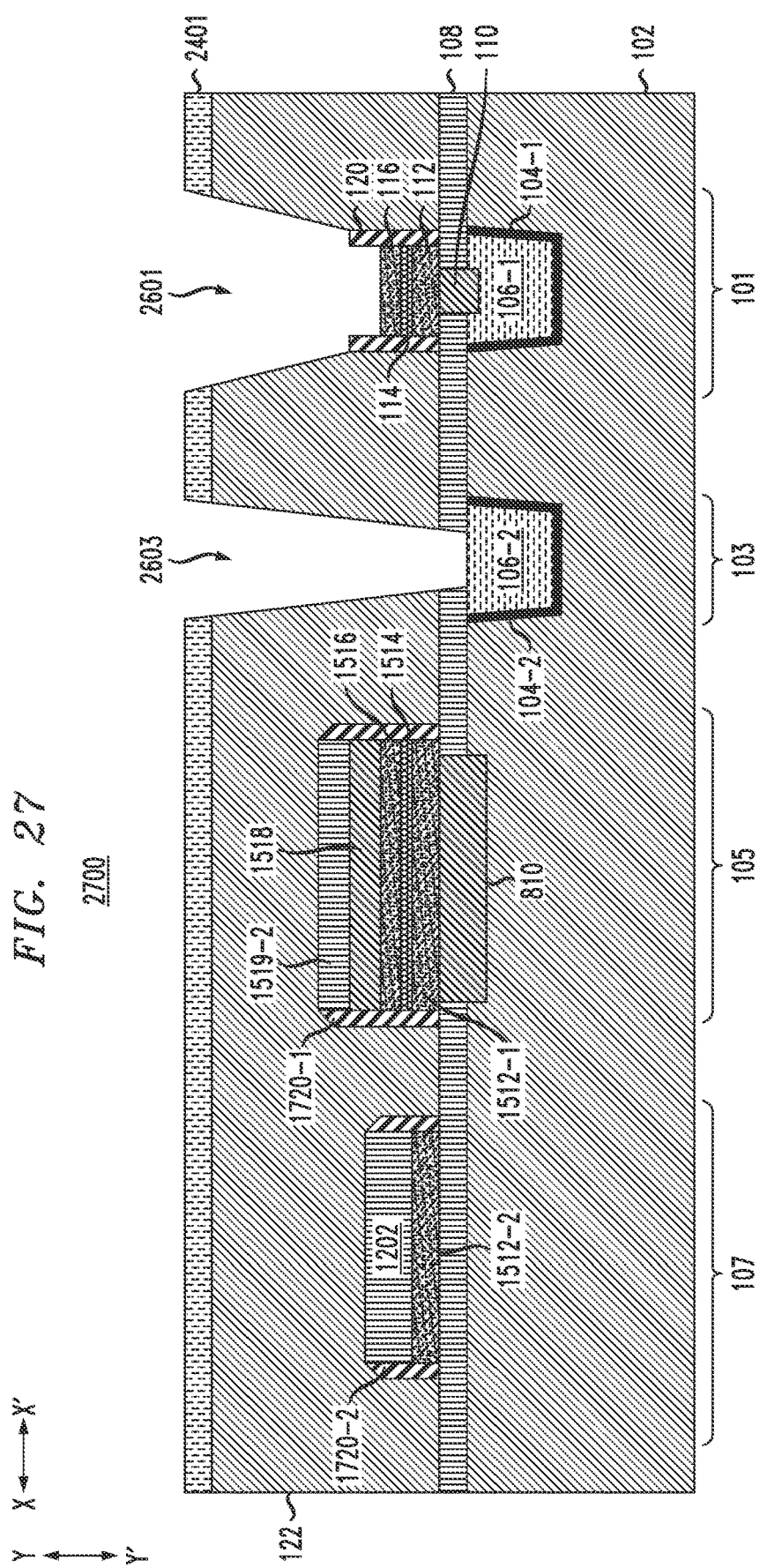
FIG. 27 depicts a cross-sectional view of the FIG. 26 structure following removal of a portion of the hard mask stack and the protection layer of the active device stack, according to an embodiment of the invention.

FIG. 27 shows a cross-sectional view 2700 of the FIG. 26 structure following removal of the remaining portions of the second hard mask stack layer 2403, which also removes the protection layer 118 (e.g., which is formed of the same material, such as TaN). The remaining portions of the second hard mask stack layer 2403 and the protection layer 118 may be removed using a wet etch. The wet etch may utilize sodium hydroxide (NaOH)/potassium hydroxide (KOH) with hydrogen peroxide ($H_2O_2$), where the concentrations of NaOH/KOH and $H_2O_2$ are tuned such that the etchant is more selective to TaN over TiN.

FIG. 28 shows a cross-sectional view 2800 of the FIG. 27 structure following removal of remaining portions of the first hard mask stack layer 2401. The remaining portions of the first hard mask stack layer 2401 may be removed using a DHF strip or other suitable processing.

FIG. 29 shows a cross-sectional view 2900 of the FIG. 28 structure following formation of contacts and vias in the contact and via trenches 2401 and 2403. This includes formation of the liner layers 124-1 and 124-2, the metal layers 126-1, 126-2 and 128, and the metal layer 225 in the region exposed by removal of the protection layer 118.

Semiconductor devices and methods for forming the same in accordance with the above-described techniques can be employed in various applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings provided herein, one of ordinary skill in the art will be able to contemplate other implementations and applications of embodiments of the invention.

In some embodiments, the above-described techniques are used in connection with semiconductor devices that may require or otherwise utilize, for example, complementary metal-oxide-semiconductors (CMOSs), metal-oxide-semiconductor field-effect transistors (MOSFETs), and/or fin field-effect transistors (FinFETs). By way of non-limiting example, the semiconductor devices can include, but are not limited to CMOS, MOSFET, and FinFET devices, and/or semiconductor devices that use CMOS, MOSFET, and/or FinFET technology.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either: (a) an intermediate product, such as a motherboard, or (b) an end product. The end product can be any product that includes integrated circuit chips, ranging from toys and other low-end applications to advanced computer products having a display, a keyboard or other input device, and a central processor. FIG. 30 shows an example integrated circuit 3000 which includes one or more active device structures 3010 having additional layers disposed between top electrodes and top electrode contacts enabling integration with metal hard mask processing as described elsewhere herein.

In some embodiments, a semiconductor structure comprises an active device stack comprising one or more layers, the one or more layers comprising a top electrode. The semiconductor structure also comprises an additional layer disposed over the active device stack, an encapsulation layer surrounding the active device stack and the additional layer, and a contact to the top electrode coupled to the additional layer.

The additional layer may comprise a protection layer, the protection layer may comprise a first material, and the top electrode may comprise a second material different than the first material. The first material may comprise a metal hard mask material that can be etched selective to the second material. The first material may comprise TaN and the second material may comprise TiN.

The additional layer and the contact may comprise a first material, and the top electrode may comprise a second material different than the first material. The first material may comprise Cu and the second material may comprise TiN.

The active device stack may comprise a pillar for a NVM device. The NVM device may comprise an RRAM device, the one or more layers of the active device stack may further comprise a bottom electrode and an insulator disposed over the bottom electrode, wherein the top electrode is disposed over the insulator.

In some embodiments, an integrated circuit comprises a NVM device structure. The NVM device structure comprises a NVM device stack comprising one or more layers, the one or more layers comprising a top electrode. The NVM device structure comprises an additional layer disposed over the NVM device stack, an encapsulation layer surrounding the NVM device stack and the additional layer, and a contact to the top electrode coupled to the additional layer.

The additional layer may comprise a protection layer. The protection layer may comprise a first material, the top electrode may comprise a second material different than the first material, and the first material may comprise a metal hard mask material that can be etched selective to the second material. The first material may comprise TaN and the second material may comprise TiN.

The additional layer and the contact may comprise a first material, and the top electrode may comprise a second material different than the first material. The first material may comprise Cu and the second material may comprise TiN.

The NVM device structure semiconductor structure may comprise an RRAM device, and one or more layers of the NVM device stack may further comprise a bottom electrode and an insulator disposed over the bottom electrode, wherein the top electrode is disposed over the insulator.

In some embodiments, a method comprises forming an active device stack comprising one or more layers, the one or more layers comprising a top electrode. The method also comprises forming an additional layer over the top electrode of the active device stack, forming an encapsulation layer surrounding the active device stack and the additional layer, and forming a contact to the top electrode, the contact being coupled to the additional layer.

The additional layer may comprise a protection layer. The protection layer may comprise a first material, the top electrode may comprise a second material different than the first material, and forming the contact to the top electrode disposed over the additional layer may comprise utilizing damascene processing with a metal hard mask of the second material. The first material may comprise TaN and the second material may comprise TiN.

The additional layer and the contact may comprise a first material, and the top electrode may comprise a second material different than the first material. The method may further comprise forming a protection layer over the top electrode, the protection layer comprising a third material different than the first material and the second material, the protection layer being surrounded by the encapsulation layer, forming a contact trench to the protection layer utilizing damascene processing with a metal hard mask comprising the third material, removing the protection layer while removing the metal hard mask, forming the additional layer in a region exposed by removal of the protection layer, and forming the contact in the contact trench. The second material may comprise TiN and the third material may comprise TaN.

It should be understood that the various layers, structures, and regions shown in the figures are schematic illustrations that are not drawn to scale. In addition, for ease of explanation, one or more layers, structures, and regions of a type commonly used to form semiconductor devices or structures may not be explicitly shown in a given figure. This does not imply that any layers, structures, and regions not explicitly shown are omitted from the actual semiconductor structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the figures to denote the same or similar features, elements, or structures, and thus, a detailed explanation of the same or similar features, elements, or structures are not repeated for each of the figures. It is to be understood that the terms "approximately" or "substantially" as used herein with regard to thicknesses, widths, percentages, ranges, temperatures, times and other process parameters, etc., are meant to denote being close or approximate to, but not exactly. For example, the term "approximately" or "substantially" as used herein implies that a small margin of error is present, such as +5%, preferably less than 2% or 1% or less than the stated amount.

In the description above, various materials, dimensions and processing parameters for different elements are provided. Unless otherwise noted, such materials are given by way of example only and embodiments are not limited solely to the specific examples given. Similarly, unless otherwise noted, all dimensions and process parameters are given by way of example and embodiments are not limited solely to the specific dimensions or ranges given.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
an active device stack comprising one or more layers, the one or more layers comprising a top electrode;
an additional layer disposed over the active device stack;
an encapsulation layer surrounding the active device stack and the additional layer; and
a contact to the top electrode coupled to the additional layer;
wherein the additional layer and the contact comprise a first material; and
wherein the top electrode comprises a second material different than the first material.

2. The semiconductor structure of claim 1, wherein the additional layer comprises a protection layer.

3. The semiconductor structure of claim 1, wherein the second material comprises titanium nitride.

4. The semiconductor structure of claim 1, wherein the first material comprises copper and the second material comprises titanium nitride.

5. The semiconductor structure of claim 1, wherein the active device stack comprises a pillar for a non-volatile memory device.

6. The semiconductor structure of claim 5, wherein the non-volatile memory device comprises a resistive random-access memory device, wherein the one or more layers of the active device stack further comprise a bottom electrode and an insulator disposed over the bottom electrode, and wherein the top electrode is disposed over the insulator.

7. An integrated circuit, comprising:
a non-volatile memory device structure comprising:
a non-volatile memory device stack comprising one or more layers, the one or more layers comprising a top electrode;
an additional layer disposed over the non-volatile memory device stack;
an encapsulation layer surrounding the non-volatile memory device stack and the additional layer; and
a contact to the top electrode coupled to the additional layer;
wherein the additional layer and the contact comprise a first material; and
wherein the top electrode comprises a second material different than the first material.

8. The integrated circuit of claim 7, wherein the additional layer comprises a protection layer.

9. The integrated circuit of claim 7, wherein the second material comprises titanium nitride.

10. The integrated circuit of claim 7, wherein the first material comprises copper and the second material comprises titanium nitride.

11. The integrated circuit of claim 7, wherein the non-volatile memory device structure comprises a resistive random-access memory device, and wherein the one or more layers of the non-volatile memory device stack further comprise a bottom electrode and an insulator disposed over the bottom electrode, and wherein the top electrode is disposed over the insulator.

12. The semiconductor structure of claim 1, wherein the first material comprises a metal material.

13. The semiconductor structure of claim 1, wherein the first material comprises one of copper, ruthenium, tungsten and cobalt.

14. The semiconductor structure of claim 1, wherein the second material comprises one of tantalum nitride, tungsten, tungsten nitride and ruthenium.

15. The integrated circuit of claim 7, wherein the first material comprises a metal material.

16. The integrated circuit of claim 7, wherein the first material comprises one of copper, ruthenium, tungsten and cobalt.

17. The integrated circuit of claim 7, wherein the second material comprises one of tantalum nitride, tungsten, tungsten nitride and ruthenium.

* * * * *